United States Patent
Miyoshi et al.

(10) Patent No.: US 9,818,907 B2
(45) Date of Patent: Nov. 14, 2017

(54) LED ELEMENT

(71) Applicant: USHIO DENKI KABUSHIKI KAISHA, Tokyo (JP)

(72) Inventors: Kohei Miyoshi, Himeji (JP); Masashi Tsukihara, Himeji (JP)

(73) Assignee: Ushio Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 14/762,387

(22) PCT Filed: Jan. 23, 2014

(86) PCT No.: PCT/JP2014/051363
§ 371 (c)(1),
(2) Date: Jul. 21, 2015

(87) PCT Pub. No.: WO2014/115800
PCT Pub. Date: Jul. 31, 2014

(65) Prior Publication Data
US 2015/0364640 A1    Dec. 17, 2015

(30) Foreign Application Priority Data

Jan. 23, 2013  (JP) ................ 2013-010554
Mar. 25, 2013  (JP) ................ 2013-062907
(Continued)

(51) Int. Cl.
*H01L 33/00* (2010.01)
*H01L 33/14* (2010.01)
(Continued)

(52) U.S. Cl.
CPC .......... *H01L 33/0025* (2013.01); *H01L 33/14* (2013.01); *H01L 33/32* (2013.01); *H01L 33/325* (2013.01); *H01L 33/04* (2013.01)

(58) Field of Classification Search
CPC ................ H01L 33/14; H01L 33/32
(Continued)

(56) References Cited

U.S. PATENT DOCUMENTS 5,777,350 A    7/1998  Nakamura et al.
7,442,962 B2 * 10/2008  Wu .................. H01L 33/14
                                                 257/103
(Continued)

FOREIGN PATENT DOCUMENTS

JP    H10-093138 A    4/1998
JP    2005-209925 A   8/2005
(Continued)

OTHER PUBLICATIONS

International Search Report; PCT/JP2014/051363; dated Feb. 18, 2014.
(Continued)

*Primary Examiner* — Olik Chaudhuri
*Assistant Examiner* — Charles N Ausar-El
(74) *Attorney, Agent, or Firm* — Studebaker & Brackett PC

(57) ABSTRACT

Provided is an LED element that ensures horizontal current spreading within an active layer, improving light-emission efficiency, without causing problems due to lattice mismatch in an n-type semiconductor layer adjacent to the active layer. This LED element is obtained by inducing c-axis growth of nitride semiconductor layers on a support substrate, and comprises a first semiconductor layer constituted of an n-type nitride semiconductor, a current-diffusion layer, an active layer constituted of a nitride semiconductor, and a second semiconductor layer constituted of a p-type nitride semiconductor. The current-diffusion has a hetero-structure having a third semiconductor layer constituted of $In_xGa_{1-x}N$ ($0<x\leq0.05$) and a fourth semiconductor layer constituted of (Continued)

n-Al$_{y1}$Ga$_{y2}$In$_{y3}$N ($0<y1<1$, $0<y2<1$, $0\leq y3\leq 0.05$, $y1+y2+y3=1$), the third semiconductor layer having a thickness of 10 nm or more and 25 nm or less.

10 Claims, 21 Drawing Sheets

(30) Foreign Application Priority Data

Dec. 26, 2013 (JP) ................................. 2013-270303
Dec. 26, 2013 (JP) ................................. 2013-270305

(51) Int. Cl.
*H01L 33/32* (2010.01)
*H01L 33/04* (2010.01)

(58) Field of Classification Search
USPC ........................................................ 257/94
See application file for complete search history.

(56) References Cited

U.S. PATENT DOCUMENTS

| | | | | |
|---|---|---|---|---|
| 7,663,138 | B2* | 2/2010 | Fujikura | B82Y 20/00 257/101 |
| 2001/0030318 | A1 | 10/2001 | Nakamura et al. | |
| 2002/0167019 | A1 | 11/2002 | Nakamura et al. | |
| 2006/0192207 | A1* | 8/2006 | Wook Shim | H01L 33/14 257/79 |
| 2008/0093610 | A1* | 4/2008 | Lee | H01L 33/02 257/94 |
| 2008/0251781 | A1 | 10/2008 | Han et al. | |
| 2010/0288999 | A1* | 11/2010 | Kikuchi | H01L 33/32 257/13 |
| 2011/0001126 | A1* | 1/2011 | Kamikawa | H01L 21/02389 257/14 |
| 2011/0240957 | A1* | 10/2011 | Okuno | H01L 33/04 257/13 |
| 2012/0326205 | A1* | 12/2012 | Nakamura | H01L 33/32 257/103 |
| 2013/0069033 | A1* | 3/2013 | Kushibe | H01L 33/06 257/13 |
| 2013/0181224 | A1* | 7/2013 | Lim | H01L 29/7786 257/76 |

FOREIGN PATENT DOCUMENTS

| | | |
|---|---|---|
| JP | 2006-245532 A | 9/2006 |
| JP | 2008-270805 A | 11/2008 |

OTHER PUBLICATIONS

Notification of Transmittal of Translation of the International Preliminary Report on Patentability and Translation of Written Opinion of the International Searching Authority; PCT/JP2014/051363 dated Aug. 6, 2015.

* cited by examiner

| InGaN thickness [nm] | Yield [%] |
|---|---|
| 3 | 74 |
| 5 | 83 |
| 10 | 93 |
| 20 | 95 |

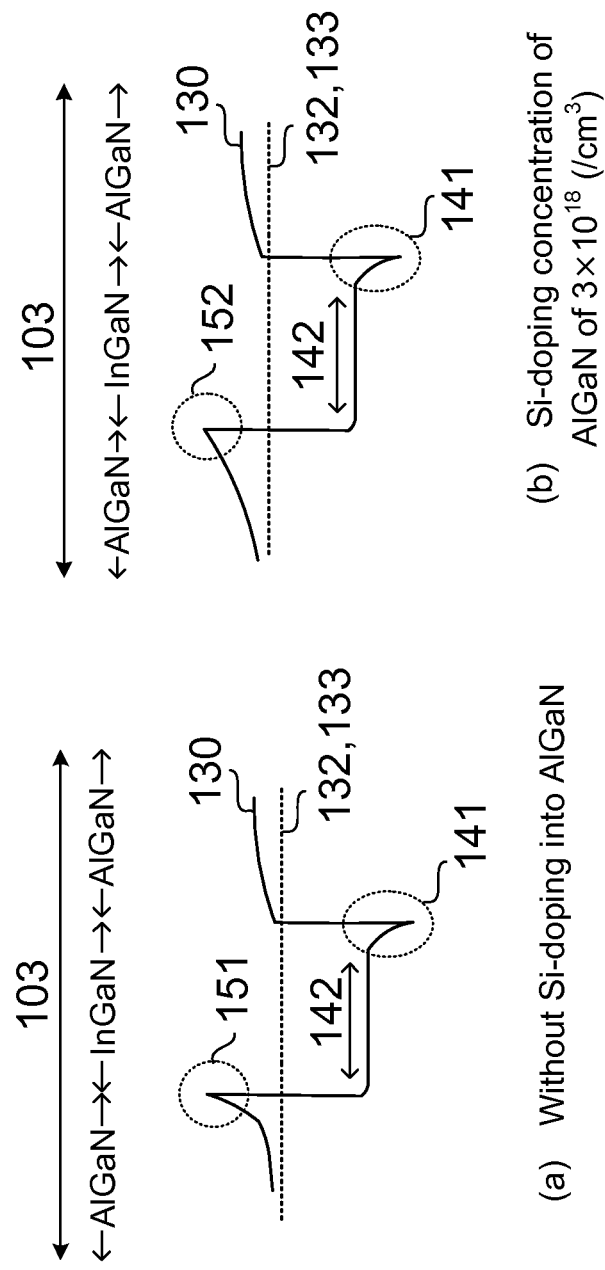

Fig. 17

| InGaN thickness [nm] | Yield [%] |
|---|---|
| 3 | 74 |
| 5 | 83 |
| 10 | 93 |
| 20 | 95 |

190

290

LED ELEMENT

TECHNICAL FIELD

The present invention relates to an LED element, and more particularly to an LED element constituted of a nitride semiconductor.

BACKGROUND ART

Conventionally as an LED element using a nitride semiconductor, a semiconductor layer structure (laminated semiconductor substrate) is formed by epitaxial growth on a sapphire substrate as represented by a blue light-emitting diode. Such a technique is disclosed, for example, in the following Patent Document 1 and Patent Document 2.

Patent Document 1 discloses an LED having a structure in which an n-type contact layer made of gallium nitride (GaN) as an n-type nitride semiconductor, an n-type cladding layer made of n-AlGaN, an active layer made of n-InGaN, a p-type cladding layer made of p-AlGaN, and a p-type contact layer made of p-GaN are sequentially laminated on a sapphire substrate. The active layer is achieved by a single-quantum well structure or a multi-quantum well Further, a buffer layer made of GaN, AlGaN, or MN is formed between the sapphire substrate and the n-type contact layer. The n-InGaN that forms the active layer is doped with a donor impurity such as Si or Ge and/or an acceptor impurity such as Zn or Mg.

Patent Document 2 discloses contents with respect to a laminated semiconductor substrate that forms an LED in which, on AlN having a plane orientation aligned in the c-axis direction, a GaN layer having a lattice constant larger than AlN and having a plane orientation aligned in the c-axis direction is formed by growth, and further, an n-AlGaN layer having a lattice constant smaller than the GaN layer, an active layer having a multi-quantum well structure, and a p-AlGaN layer are sequentially formed thereon.

PRIOR ART DOCUMENT

Patent Document

Patent Document 1: JP-A-10-93138
Patent Document 2: JP-A-2005-209925

SUMMARY OF THE INVENTION

Problems to be Solved by the Invention (First Problem)
Nitride semiconductors such as GaN and AlGaN have the wurtzite crystal structure (hexagonal crystal structure). Regarding the plane of the wurtzite crystalline structure, the crystal face and the orientation are represented by a fundamental vector indicated by a1, a2, a3 and c according to the 4 index notation (hexagonal indexing). The fundamental vector c extends in the direction of [0001], and this direction is called "c-axis". The plane perpendicular to the c-axis is called "c-plane" or "(0001) plane".

Conventionally, in preparing a semiconductor light-emitting element by using a nitride semiconductor, a substrate having the c-plane substrate as a principal plane is used as a substrate on which the nitride semiconductor crystal is grown. Actually, on this substrate, an undoped GaN layer is grown, and further, an n-type nitride semiconductor layer is grown thereon.

FIG. 23 is a schematic sectional view showing a structure of a conventional semiconductor light-emitting element 190. In the following drawings, the actual dimensional ratio and the depicted dimensional ratio on the drawing do not necessarily coincide with each other.

The LED element 190 has an undoped layer 113 in which an undoped GaN layer, for example, is formed to a thickness of 3 μm on top of a support substrate 111 such as sapphire, and has an n-type cladding layer 115 in which an n-AlGaN layer, for example, is formed to a thickness of 1.5 μm on top of the undoped layer. Further, the LED element 190 has, on top of the n-type cladding layer 115, an active layer 117 in which an MQW (Multi-quantum Well) is formed, for example, by alternate lamination of InGaN having a thickness of 2 nm that forms a well layer and an AlGaN having a thickness of 5 nm that forms a barrier layer. Further, the LED element 190 has a p-type cladding layer 119 formed, for example, of a p-AlGaN layer on top of the active layer 117, and has a p-type contact layer 121 formed of a $p^+$-GaN layer on top of the p-type contact layer. Here, the LED element 190 has a last barrier layer formed of AlGaN between the active layer 117 and the p-type cladding layer 119 in accordance with the needs.

Here, the lattice constant of AlGaN that constitutes the n-type cladding layer 115 is smaller than the lattice constant of GaN that constitutes the undoped layer 113 located therebelow. For this reason, a tensile stress 181 is generated in the n-type cladding layer 115 due to lattice mismatch. Here, the arrow that the tensile stress 181 indicates represents the direction of the stress. This tensile stress 181 increases in accordance with the increase in the thickness of the n-type cladding layer 115 and, when this exceeds a certain threshold value, a misfit dislocation accompanying a surface roughness, cracks, or crystal defects is generated, thereby inviting decrease in the light-emission efficiency.

On the other hand, when the thickness of the n-type cladding layer 115 is made too small, a situation is invited in which, when a voltage is applied between the n-type cladding layer 115 and a power supply terminal (not illustrated in the drawings) formed on a top surface of the p-type contact layer 121, an electric current flows to the n-type cladding layer 115 from the power supply terminal via the p-type contact layer 121, the p-type cladding layer 119, and the active layer 117 located in a neighborhood immediately therebelow. For this reason, the electric current flows only in a region of a part of the active layer 117, so that the light-emission region becomes small, thereby eventually inviting decrease in the light-emission efficiency. Further, because the electric current flows through a part of the active layer 117, a current concentration occurs locally, whereby a carrier non-uniformity is generated in the active layer 117, so that a high light-emission intensity cannot be obtained.

(Second Problem)
Nitride semiconductors such as GaN and AlGaN have the wurtzite crystal structure (hexagonal crystal structure). Regarding the plane of the wurtzite crystalline structure, the crystal face and the orientation are represented by a fundamental vector indicated by a1, a2, a3 and c according to the 4 index notation (hexagonal indexing). The fundamental vector c extends in the direction of [0001], and this direction is called "c-axis". The plane perpendicular to the c-axis is called "c-plane" or "(0001) plane".

Conventionally, in preparing a semiconductor light-emitting element by using a nitride semiconductor, a substrate having the c-plane substrate as a principal plane is used as a substrate on which the nitride semiconductor crystal is grown. Actually, on this substrate, an undoped GaN layer is grown, and further, an n-type nitride semiconductor layer is grown thereon.

FIG. 24 is a schematic sectional view showing a structure of a conventional semiconductor light-emitting element 290. In the following drawings, the actual dimensional ratio and the depicted dimensional ratio on the drawing do not necessarily coincide with each other.

The LED element 290 has an undoped layer 213 in which an undoped GaN layer, for example, is formed to a thickness of 3 μm on top of a support substrate 211 such as sapphire, and has an n-type cladding layer 215 in which an n-AlGaN layer, for example, is formed to a thickness of 1.5 μm on top of the undoped layer. Further, the LED element 290 has, on top of the n-type cladding layer 215, an active layer 217 in which an MQW (Multi-quantum Well) is formed, for example, by alternate lamination of InGaN having a thickness of 2 nm that forms a well layer and an AlGaN having a thickness of 5 nm that forms a barrier layer. Further, the LED element 290 has a p-type cladding layer 219 formed, for example, of a p-AlGaN layer on top of the active layer 217, and has a p-type contact layer 221 formed of a p$^+$-GaN layer on top of the p-type contact layer. Here, the LED element 290 has a last barrier layer formed of AlGaN between the active layer 217 and the p-type cladding layer 219 in accordance with the needs.

Here, the lattice constant of AlGaN that constitutes the n-type cladding layer 215 is smaller than the lattice constant of GaN that constitutes the undoped layer 213 located therebelow. For this reason, a tensile stress 281 is generated in the n-type cladding layer 215 due to lattice mismatch. Here, the arrow that the tensile stress 281 indicates represents the direction of the stress. This tensile stress 281 increases in accordance with the increase in the thickness of the n-type cladding layer 215 and, when this exceeds a certain threshold value, a misfit dislocation accompanying a surface roughness, cracks, or crystal defects is generated, thereby inviting decrease in the light-emission efficiency.

On the other hand, when the thickness of the n-type cladding layer 215 is made too small, a situation is invited in which, when a voltage is applied between the n-type cladding layer 215 and a power supply terminal (not illustrated in the drawings) formed on a top surface of the p-type contact layer 221, an electric current flows to the n-type cladding layer 215 from the power supply terminal via the p-type contact layer 221, the p-type cladding layer 219, and the active layer 217 located in a neighborhood immediately therebelow. For this reason, the electric current flows only in a region of a part of the active layer 217, so that the light-emission region becomes small, thereby eventually inviting decrease in the light-emission efficiency. Further, because the electric current flows through a part of the active layer 217, a current concentration occurs locally, whereby a carrier non-uniformity is generated in the active layer 217, so that a high light-emission intensity cannot be obtained.

In view of the aforementioned problems, an object of the present invention is to achieve an LED element that ensures horizontal current spreading within an active layer, improving light-emission efficiency, without causing problems due to lattice mismatch in an n-type semiconductor layer adjacent to the active layer.

Means for Solving the Problem

An LED element according to the present invention, which is obtained by inducing c-axis growth of nitride semiconductor layers on a support substrate, comprises:
a first semiconductor layer constituted of an n-type nitride semiconductor;
a current-diffusion layer formed on the first semiconductor layer;
an active layer formed on the current-diffusion layer and constituted of a nitride semiconductor; and
a second semiconductor layer formed on the active layer and constituted of a p-type nitride semiconductor, wherein
the current-diffusion layer has a hetero-structure having a third semiconductor layer constituted of In$_x$Ga$_{1-x}$N (0<x≤0.05) and a fourth semiconductor layer constituted of n-Al$_{y1}$Ga$_{y2}$In$_{y3}$N (0<y1<1, 0<y<2<1, 0≤y3≤0.05, y1+y2+y3=1), the third semiconductor layer having a thickness of 10 nm or more and 25 nm or less.

By the hetero-structure having a third semiconductor layer constituted of In$_x$Ga$_{1-x}$N and a fourth semiconductor layer constituted of n-Al$_{y1}$Ga$_{y2}$In$_{y3}$N (0<y1<1, 0<y2<1, 0≤y3⌣0.05, y1+y2+y3=1), a band-bending region is formed at the interface between the two layers due to the difference in the bandgap of the two materials. A two-dimensional electron gas layer having a high mobility in the horizontal direction is formed in this band-bending region.

Here, when the In ratio of In$_x$Ga$_{1-x}$N is increased to be higher than 10%, a distortion of the energy band due to the piezoelectric field is generated, and the light-emission efficiency decreases due to the quantum Stark effect. This applies also to a case in which the active layer is achieved by a multi-quantum well structure formed by repetition of a well layer made of In$_a$Ga$_{1-a}$N (0<a≤1) and a barrier layer made of Al$_b$Ga$_{1-b}$N (0<b≤1). Here, the ratio of the In composition is a factor that determines the wavelength of the radiated light. In other words, the present invention is useful particularly as an LED element that produces light that can be taken out when the In ratio of In$_x$Ga$_{1-x}$N constituting the current-diffusion layer and In$_a$Ga$_{1-a}$N (0<a≤1) constituting the active layer is reduced to be 10% or less, that is, near ultraviolet light having a wavelength of, for example, about 365 nm.

Also, the thickness of the third semiconductor layer made of In$_x$Ga$_{1-x}$N is made to be 10 nm or more and 25 nm or less, which is sufficiently larger than the thickness (for example, about 2 nm) of In$_x$Ga$_{1-x}$N formed for constructing the well layer of a general multi-quantum well structure. In a general multi-quantum well structure, the thickness of In$_x$Ga$_{1-x}$N is made to be about 2 nm, at most 3 nm, in order to prevent decrease in the light-emission ratio caused by the quantum Stark effect.

However, in the LED element of the present invention, the thickness of In$_x$Ga$_{1-x}$N constituting the current-diffusion layer is made to be 10 nm or more and 25 nm or less. By increasing the film thickness in this manner, an approximately flat band region formed by In$_x$Ga$_{1-x}$N can be widened, and the capacity for ensuring the electrons can be increased. Until the electrons are sufficiently accumulated in this region, the electrons cannot cross over the barrier formed by the fourth semiconductor layer (n-Al$_{y1}$Ga$_{y2}$In$_{y3}$N). During this period, the two-dimensional electron gas moves in a direction parallel to the interface, so that the electrons are diffused in the horizontal direction. In other words, the electrons move to the p-layer side by crossing over the barrier of n-Al$_{y1}$Ga$_{y2}$In$_{y3}$N at a stage in which the electrons are sufficiently diffused in the horizontal direction and a sufficient amount of electrons are accumulated in the band-bending region and the approximately flat band region. In other words, electron spreading in the horizontal direction is once achieved before the electric current flows from the p-layer side to the n-layer side. This provides horizontal spreading of the electric current that flows within the active layer, whereby light emission can be made in the whole of the active layer, and the light-emission efficiency can be increased.

On the other hand, by eager researches made by the present inventors, it has been found out that, when the thickness of $In_xGa_{1-x}N$ is increased to be larger than 25 nm, for example, 30 nm, the optical output decreases because the problems such as crystal defects become conspicuous. In other words, the thickness of $In_xGa_{1-x}N$ is preferably set to be a thickness smaller than or equal to a critical film thickness that does not generate crystal defects.

Therefore, by setting the thickness of $In_xGa_{1-x}N$ to be 10 nm or more and 25 nm or less as described above, an effect of improving the optical output is obtained as compared with a conventional LED element. Here, as will be described later, by setting the thickness of $In_xGa_{1-x}N$ to be within the aforesaid range, an effect of improving the breakdown voltage to ESD (Electro Static Discharge: electrostatic discharge) of the element can also be obtained.

Here, the In composition contained in the fourth semiconductor layer assumed to be $n-Al_{y1}Ga_{y2}In_{y3}N$ may be 0. However, by allowing the fourth semiconductor layer to contain In within a range of 5%, an effect of further improving the optical output is obtained.

The band gap energy of the third semiconductor layer may be smaller than the band gap energy of each of the first semiconductor layer and the fourth semiconductor layer. By adopting such a construction, a two-dimensional electron gas layer can be formed at the interface between the third semiconductor layer and the fourth semiconductor layer.

Further, by eager researches made by the present inventors, it has been found out that such an effect of improving the optical output can be ensured by setting the Si-doping concentration of $n-Al_{y1}Ga_{y2}In_{y3}N$ constituting the fourth semiconductor layer to be $1\times10^{18}/cm^3$ or more and $5\times10^{18}/cm^3$ or less. It has also been found out that, when the Si-doping concentration is set to be, for example, $5\times10^{17}/cm^3$ which is a value smaller than $1\times10^{18}/cm^3$, a carrier non-uniformity is generated in the active layer accompanying an absolute carrier insufficiency, whereas when the Si-doping concentration is set to be, for example, $9\times10^{18}/cm^3$ which is a value higher than $5\times10^{18}/cm^3$, a droop phenomenon occurs, so that a high optical output cannot be obtained in either case.

Therefore, by further setting the Si-doping concentration of $n-Al_{y1}Ga_{y2}In_{y3}N$ to be $1\times10^{18}/cm^3$ or more and $5\times10^{18}/cm^3$ or less upon setting the thickness of $In_xGa_{1-x}N$ to be 10 nm or more and 25 nm or less, an effect of further improving the optical output is obtained as compared with a conventional LED element.

The current-diffusion layer may have a plurality of the hetero-structure formed by lamination of a plurality of pairs of the third semiconductor layer and the fourth semiconductor layer.

When such a construction is adopted, a plurality of electron wells where the two-dimensional electron gas layer is formed are formed because a plurality of interfaces of the heterojunction are formed. Also, a plurality of electron wells by $In_xGa_{1-x}N$ functioning as an electron accumulation layer are formed. This further enhances the effect of electric current spreading.

An LED element according to the present invention, which is obtained by inducing c-axis growth of nitride semiconductor layers on a support substrate, comprises:

an undoped layer formed on the support substrate;

a fifth semiconductor layer formed on the undoped layer and constituted of an n-type nitride semiconductor;

a hetero-structure formed of a lamination structure on the fifth semiconductor layer, the lamination structure obtained by lamination of a sixth semiconductor layer constituted of $n-Al_{x1}Ga_{x2}In_{x3}N$ ($0<x1<1$, $0<x2<1$, $0\leq x3\leq 0.05$, $x1+x2+x3=1$) having an Si-doping concentration of $1\times10^{18}/cm^3$ or more and $1\times10^{19}/cm^3$ or less and a seventh semiconductor layer constituted of $In_yGa_{1-y}N$ having a thickness of 10 nm or more and 25 nm or less; and an eighth semiconductor layer formed on the hetero-structure and constituted of a p-type nitride semiconductor, wherein a peak light-emission wavelength is 362 nm or more and 395 nm or less.

By the hetero-structure having the sixth semiconductor layer constituted of $n-Al_{x1}Ga_{x2}In_{x3}N$ ($0<x1<1$, $0<x2<1$, $0\leq x3\leq 0.05$, $x1+x2+x3=1$) and the seventh semiconductor layer constituted of $In_yGa_{1-y}N$, a band-bending region is formed at the interface between the two layers due to the difference in the bandgap of the two materials. A two-dimensional electron gas layer having a high mobility in the horizontal direction is formed in this band-bending region. Here, in the following description, the sixth semiconductor layer will be sometimes abbreviated as "$n-Al_{x1}Ga_{x2}In_{x3}N$" at appropriate times.

The In ratio of $In_yGa_{1-y}N$, that is, the y-value, determines the peak light-emission wavelength of the LED element. When the In ratio of $In_yGa_{1-y}N$ is decreased, the peak light-emission wavelength from the LED element moves to a shorter-wavelength side. Conversely, when the In ratio is increased, the peak light-emission wavelength moves to a longer-wavelength side.

Here, when the peak light-emission wavelength is set to be a value longer than 395 nm, for example, 400 nm, the In ratio of $In_yGa_{1-y}N$ becomes too high. As a result of this, a distortion of the energy band caused by the piezoelectric field is generated, and the light-emission efficiency decreases due to the quantum Stark effect. In addition, a lattice relaxation occurs in the $In_yGa_{1-y}N$ layer, so that a misfit dislocation is generated, and decrease in the light-emission efficiency is generated. On the other hand, when it is attempted to set the peak light-emission wavelength to be a value shorter than 362 nm, for example, 357 nm, the In ratio of $In_yGa_{1-y}N$ must be set to be extremely low. However, in the present construction, unlike the LED element having a conventional MQW, the film thickness of $In_yGa_{1-y}N$ is set to be a large film thickness of 10 nm or more and 25 nm or less. For this reason, addition of a small amount of In is difficult, and it is difficult to realize light of a short wavelength such as 357 nm. Due to these reasons, the LED element of the present invention is suitable for an element having a peak light-emission wavelength of 362 nm or more and 395 nm or less.

As described above, in the LED element of the present invention, the thickness of the $In_yGa_{1-y}N$ layer is set to be 10 nm or more and 25 nm or less, which is sufficiently larger than the thickness (for example, about 2 nm) of $In_yGa_{1-y}N$ formed for constructing the well layer of a general MQW structure. In a general MQW structure, the thickness of $In_yGa_{1-y}N$ is set to be about 2 nm, at most 7 nm, in order to prevent decrease in the light-emission ratio caused by the quantum Stark effect.

However, in the LED element of the present invention, the thickness of $In_yGa_{1-y}N$ constituting the hetero-structure is made to be 10 nm or more and 25 nm or less. By increasing the film thickness in this manner, an approximately flat band region formed by $In_yGa_{1-y}N$ can be widened, and the capacity for ensuring the electrons can be increased. Until the electrons are sufficiently accumulated in this region, the electrons cannot cross over the barrier formed by $n-Al_{x1}Ga_{x2}In_{x3}N$. During this period, the two-dimensional electron gas moves in a direction parallel to the interface, so that the electrons are diffused in the horizontal direction. In other words, the electrons move to the p-layer side by crossing over the barrier of n-$Al_{x1}Ga_{x2}In_{x3}N$ at a stage in which the electrons are sufficiently diffused in the horizontal direction and a sufficient amount of electrons are accumulated in the band-bending region and the approximately flat band region. In other words, electron spreading in the horizontal direction is once achieved before the electric current flows from the p-layer side to the n-layer side. This provides horizontal spreading of the electric current that flows within the active layer, whereby light emission can be made in the whole of the active layer, and the light-emission efficiency can be increased.

On the other hand, by eager researches made by the present inventors, it has been found out that, when the thickness of $In_yGa_{1-y}N$ is increased to be larger than 25 nm, for example, 30 nm, the optical output decreases because the problems such as crystal defects become conspicuous. In other words, the thickness of $In_yGa_{1-y}N$ is preferably set to be a thickness smaller than or equal to a critical film thickness that does not generate crystal defects.

Therefore, by setting the thickness of $In_yGa_{1-y}N$ to be 10 nm or more and 25 nm or less as described above, an effect of improving the optical output is obtained as compared with a conventional LED element. Here, as will be described later, by setting the thickness of $In_yGa_{1-y}N$ to be within the aforesaid range, an effect of improving the breakdown voltage to ESD (Electro Static Discharge: electrostatic discharge) of the element can also be obtained.

Here, the In composition contained in the sixth semiconductor layer assumed to be n-$Al_{x1}Ga_{x2}In_{x3}N$ may be 0. However, by allowing the sixth semiconductor layer to contain In within a range of 5%, an effect of further improving the optical output is obtained.

Further, by eager researches made by the present inventors, it has been found out that such an effect of improving the optical output can be ensured by setting the Si-doping concentration of n-$Al_{x1}Ga_{x2}In_{x3}N$ constituting the fourth semiconductor layer to be $1\times10^{18}/cm^3$ or more and $5\times10^{18}/cm^3$ or less. For example, when the Si-doping concentration is set to be a value smaller than $1\times10^{18}/cm^3$, such as $5\times10^{17}/cm^3$, the screening effect of the conduction band of the n-$Al_{x1}Ga_{x2}In_{x3}N$ layer is small because the absolute Si concentration is low, so that a sufficient amount of carriers cannot be taken into the band-bending region and the approximately flat band region. Because of this, it has been found out that a high optical output cannot be obtained. On the other hand, when the Si-doping concentration is set to be a value larger than $1\times10^{19}/cm^3$, such as $2\times10^{19}/cm^3$, a droop phenomenon occurs, and it has been found out that a high optical output cannot be obtained.

Therefore, by further setting the Si-doping concentration of n-$Al_{x1}Ga_{x2}In_{x3}N$ to be $1\times10^{18}/cm^3$ or more and $5\times10^{18}/cm^3$ or less upon setting the thickness of $In_yGa_{1-y}N$ to be 10 nm or more and 25 nm or less, an effect of further improving the optical output is obtained as compared with a conventional LED element.

Here, by the eager researches made by the present inventors and others, it has been found out that, according to the above-described construction, the Si-doping concentration can be made to be higher as compared with the LED element provided with a conventional MQW, so that an effect of reducing the operation voltage at the time of high current injection can be also obtained.

Also, the LED element of the present invention may be constructed to have a multilayer structure part obtained by repetition of the hetero-structure for a plurality of periods, wherein the eighth semiconductor layer is formed on top of the hetero-structure located at the topmost layer of the multilayer structure part.

When such a construction is adopted, a plurality of regions where the two-dimensional electron gas layer is formed are formed because a plurality of interfaces of the heterojunction are formed. Also, a plurality of approximately flat band regions formed by $In_yGa_{1-y}N$ functioning as an electron accumulation layer are formed. This further enhances the effect of electric current spreading and can further improve the optical output.

Effect of the Invention

According to the present invention, horizontal current spreading can be achieved while forming the n-type cladding layer to have a film thickness within a range that does not invite crystal defects, so that an LED element having a high light-emission efficiency can be achieved.

BRIEF DESCRIPTION OF THE DRAWINGS

FIG. 7 is a model view of the energy band diagram of the conduction band of the current-diffusion layer by reflecting the interaction of the semiconductor materials.

FIG. 17 is a table showing a relationship between the thickness of the $In_yGa_{1-y}N$ layer and the yield of the LED element.

MODE FOR CARRYING OUT THE INVENTION

First Embodiment

The first embodiment of the present invention will be described.

[Structure]

Figure 1:
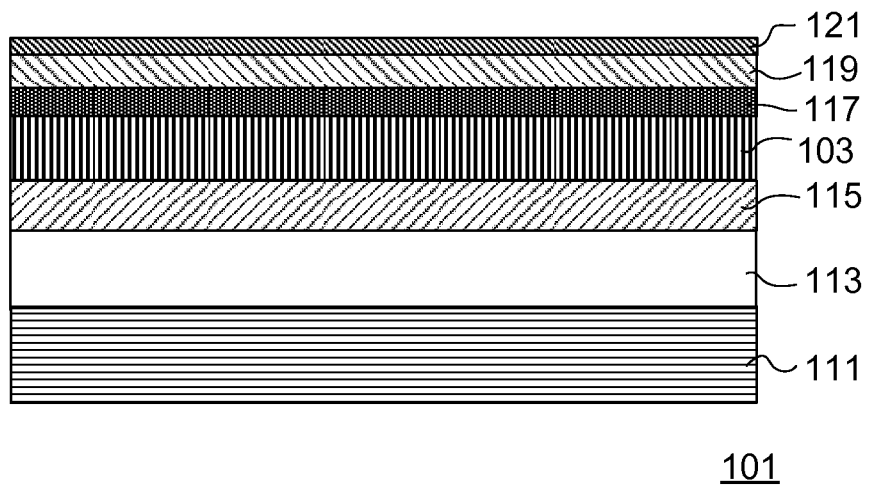
FIG. 1 is a schematic sectional view showing a structure of an LED element according to the present invention.
Figure 23:
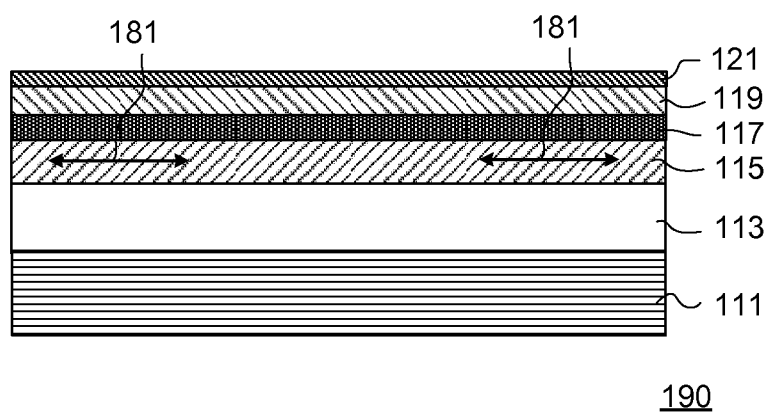
FIG. 23 is a schematic sectional view showing a structure of a conventional LED element.

FIG. 1 is a schematic sectional view showing a structure of an LED element 101 according to the present invention. Here, constituent elements identical to those of the LED element 190 shown in FIG. 23 are denoted with identical reference symbols. Also, in each of the following drawings, the dimension ratio in the Figures does not necessarily coincide with the actual dimension ratio.

Compared with the LED element 190, the LED element 101 is different in that the LED element 101 is additionally provided with a current-diffusion layer 103. In other words, the LED element 101 is constructed to include, in the order from below, an undoped layer 113, an n-type cladding layer 115 (corresponding to the "first semiconductor layer"), a current-diffusion layer 103, an active layer 117, a p-type cladding layer 119 (corresponding to the "second semiconductor layer"), and a p-type contact layer 121 on top of a support substrate 111 made of sapphire or the like. Also, in the same manner as in the LED element 190, the LED element 101 has a last barrier layer (not illustrated in the drawings) in accordance with the needs between the active layer 117 and the p-type cladding layer 119.

(Support Substrate 111)

The support substrate 111 is constituted of a sapphire substrate. Here, besides sapphire, the support substrate 111 may be constituted of Si, SiC, GaN, YAG, or the like.

(Undoped Layer 113)

The undoped layer 113 is formed of GaN. More specifically, the undoped layer 113 is formed of a low-temperature buffer layer made of GaN and an underlayer made of GaN on top thereof.

(n-Type Cladding Layer 115)

The n-type cladding layer 115 is constituted of $n-Al_nGa_{1-n}N$ ($0<n<1$). Here, the n-type cladding layer 115 may be constructed to include a layer (protective layer) constituted of n-GaN in a region that is in contact with the undoped layer 113. In this case, the protective layer is doped with an n-type impurity such as Si, Ge, S, Se, Sn, or Te, and in particular is preferably doped with Si.

Here, in the present embodiment, the n-type cladding layer 115 is formed of $n-Al_{0.1}Ga_{0.9}N$ as one example.

(Active Layer 117)

The active layer 117 is formed, for example, of a semiconductor layer having a multiquantum well structure (MQW) made by repetition of a well layer made of $In_aGa_{1-a}N$ ($0<a\leq1$) and a barrier layer made of $Al_bGa_{1-b}N$ ($0<b\leq1$). These layers may be either non-doped or doped to be of p-type or n-type.

In the present embodiment, the well layer in the active layer 117 is made of $In_{0.04}Ga_{0.96}N$; the barrier layer in the active layer 117 is made of $Al_{0.06}Ga_{0.94}N$; and the active layer 117 is formed by repetition of the well layer and the barrier layer for 5 periods, as one example. In the LED element 101, the number of repetition periods is not limited to 5.

(p-Type Cladding Layer 119)

The p-type cladding layer 119 is constituted, for example, of $p-Al_cGa_{1-c}N$ ($0<c\leq1$) and is doped with a p-type impurity such as Mg, Be, Zn, or C. In the present embodiment, the p-type cladding layer 119 is formed of a lamination structure of $p-Al_{0.3}Ga_{0.7}N$ and $p-Al_{0.07}Ga_{0.93}N$. Here, the p-type cladding layer 119 may be constructed to include a layer (protective layer) constituted of GaN in a region that is in contact with the p-type contact layer 121. In this case, the protective layer is doped with a p-type impurity such as Mg, Be, Zn, or C.

(p-Type Contact Layer 121)

The p-type contact layer 121 is constituted, for example, of p-GaN. In particular, the p-type contact layer 121 is constituted of a $p^+$-GaN layer doped with a p-type impurity such as Mg, Be, Zn, or C at a high concentration.

(Current-Diffusion Layer 103)

The current-diffusion layer 103 is formed of a hetero-structure having a layer (corresponding to the "third semiconductor layer") made of $In_xGa_{1-x}N$ ($0<x\leq0.05$) and a layer (corresponding to the "fourth semiconductor layer") made of n-$Al_{y1}Ga_{y2}In_{y3}N$ ($0<y1<1$, $0<y2<1$, $0\leq y3\leq 0.05$, $y1+y2+y3=1$). Among these, the thickness of $In_xGa_{1-x}N$ constituting the third semiconductor layer is 10 nm or more and 25 nm or less.

[Description of Effect of Current-Diffusion Layer 103]

Hereafter, improvement in the light-emission efficiency of the LED element 101, as compared with the conventional LED element 190, brought about by being provided with the current-diffusion layer 103 having the above construction will be described with reference to Examples.

(Studies on the in Composition of Third Semiconductor)

Figure 2:
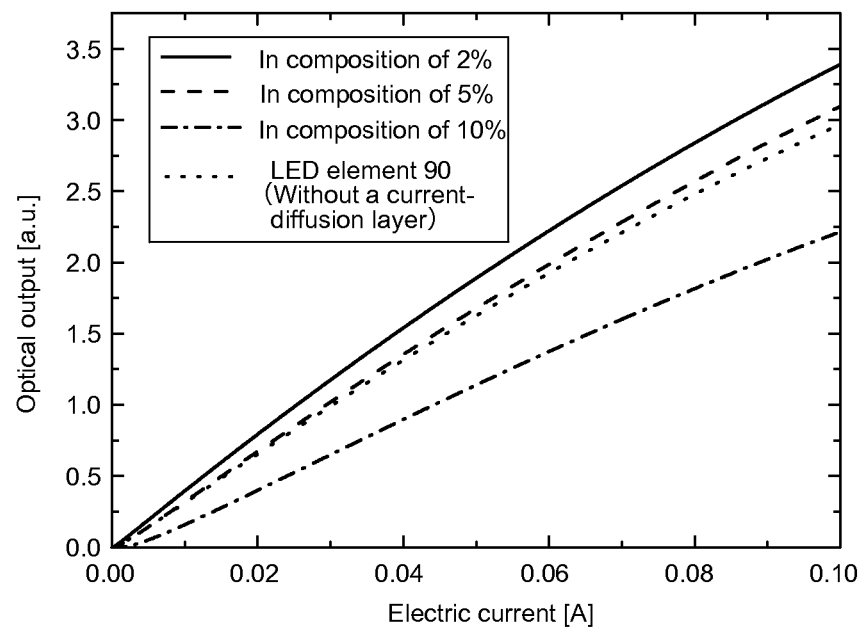
FIG. 2 is a graph showing a relationship between the electric current flowing in the active layer and the optical output obtained from the LED element when the In composition of $In_xGa_{1-x}N$ is changed.

FIG. 2 is a graph showing a relationship between the electric current flowing in the active layer 117 and the optical output obtained from the LED element 101 when the In composition, that is, the x-value, of $In_xGa_{1-x}N$ (third semiconductor layer) constituting the current-diffusion layer 103 is changed. Here, for comparison, data of the conventional LED element 190 that is not provided with the current-diffusion layer 103 are also shown.

It will be understood that, in the case in which the In composition is 2% or 5%, a larger optical output is obtained in either case as compared with the conventional LED element 190. On the other hand, it will be understood that, in the case in which the In composition is set to be 10%, the optical output decreases as compared with the conventional LED element 190. This result seems to suggest the following.

Figure 3A:
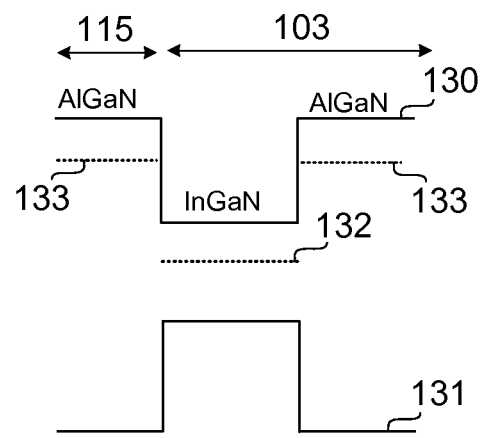
FIG. 3A is a model view showing an ideal energy band diagram of the current-diffusion layer.
Figure 3B:
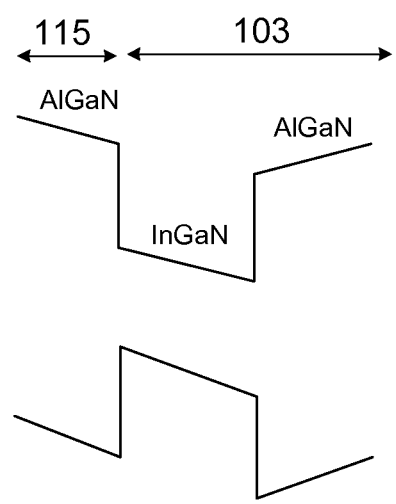
FIG. 3B is a model view showing the energy band diagram of the current-diffusion layer by reflecting the influence of the piezoelectric field.

FIGS. 3A and 3B are model views showing an energy band diagram of the current-diffusion layer 103. Here, in the following, the third semiconductor layer is denoted as InGaN, and the fourth semiconductor layer is denoted as AlGaN when attention is not paid to the composition of each atom; however, this does not define that the ratio of atoms other than nitrogen is 1:1. Here, description will be given assuming that the In composition contained in the fourth semiconductor layer is 0% (n-$Al_yGa_{1-y}N$); however, similar arguments can be made even with the fourth semiconductor layer containing In within a range of 5%.

As compared with InGaN, AlGaN has a larger band gap. For this reason, an approximately flat band region by InGaN is formed between n-AlGaN constituting the n-type cladding layer 115 and AlGaN of the current-diffusion layer 103 when the influence of the polarization electric field described later is not considered, as shown in FIG. 3A. Here, the thickness of InGaN constituting the current-diffusion layer 103 is far larger than the thickness (for example, 2 nm) of InGaN constituting the active layer 117 and is constructed to be 10 nm or more and 25 nm or less, so that the approximately flat band region is widely formed.

In the LED element 101, a piezoelectric polarization (piezo polarization) is generated in the c-axis direction perpendicular to the plane of the flat band region formed by the InGaN layer.

FIG. 3B is a model view showing the energy band of the current-diffusion layer 103 drawn by considering the influence of this piezoelectric field. By the piezoelectric field, a distortion is generated in the energy band.

When the distortion of the energy band increases, the overlap of wave functions of the electrons and holes decreases, whereby a so-called quantum Stark effect is generated in which the ratio of light emission brought about by recombination of electrons and holes decreases. This distortion increases according as the In composition ratio in InGaN increases. FIG. 2 shows that, when the In composition is increased to be 10%, the optical output decreases as compared with the conventional LED element 190 that is not provided with the current-diffusion layer 103. This seems to be because the quantum Stark effect has become conspicuous.

On the other hand, in the case in which the In composition is 2% or 5%, the optical output increases as compared with the conventional LED element 190. This seems to be due to the following reasons.

Compared with InGaN, AlGaN has a larger electronic band gap, as shown in FIG. 3A. FIG. 3A shows the conduction band 130 and the valence electron band 131 as well as the Fermi level 132 of InGaN and the Fermi level 133 of AlGaN. Here, in FIG. 3A, the interaction between InGaN and AlGaN is not taken into consideration.

Figure 3C:
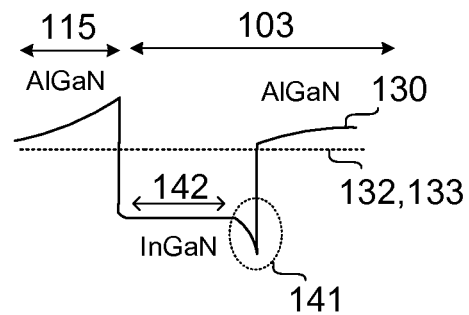
FIG. 3C is a model view showing the energy band diagram of the conduction band of the current-diffusion layer by reflecting the interaction of the semiconductor materials.

FIG. 3C is a model view showing the state of the conduction band 130 by reflecting the interaction of the two semiconductor materials. The Fermi levels 132 and 133 become equal to each other. However, due to the discontinuity of the energy bands of AlGaN and InGaN, the conduction band of the AlGaN layer close to the p-layer is pulled downwards, whereby a band-bending region 141 is generated. In this band-bending region 141, a two-dimensional electron gas layer having a high horizontal mobility is formed. Also, as described above, by increasing the thickness of the InGaN layer, the approximately flat band region 142 is widened, and a large amount of electrons can be accumulated, so that the electrons do not overflow by crossing over the potential of AlGaN until the electrons are accumulated in the band-bending region 141 formed at the interface between AlGaN and InGaN and in the approximately flat band region 142 of InGaN. In other words, horizontal electron movement is achieved and, as a result of this, horizontal current spreading can be achieved. In other words, the current-diffusion layer 103 is achieved by AlGaN and InGaN.

From the above, it will be understood that an effect of improving the optical output of the LED element 101 is obtained by setting the In ratio of InGaN to be larger than 0% and 5% or less.

Also, in particular, by increasing the thickness of InGaN, the current spreading effect can be enhanced, and this further contributes to the improvement of the optical output. This will be described in the following.

(Studies on Thickness of Third Semiconductor Layer)

As described above, because InGaN forms the approximately flat band region 142, it is preferable to increase the thickness of the third semiconductor layer (InGaN) in order to enhance the capability of accumulating the electrons. However, due to the difference of the lattice constants of GaN and InGaN, a lattice relaxation occurs when the thickness of InGaN is increased to be too large. This results in that the electrons cannot be sufficiently accumulated in the band-bending region 141 and in the approximately flat band region 142.

Figures 4, 5:
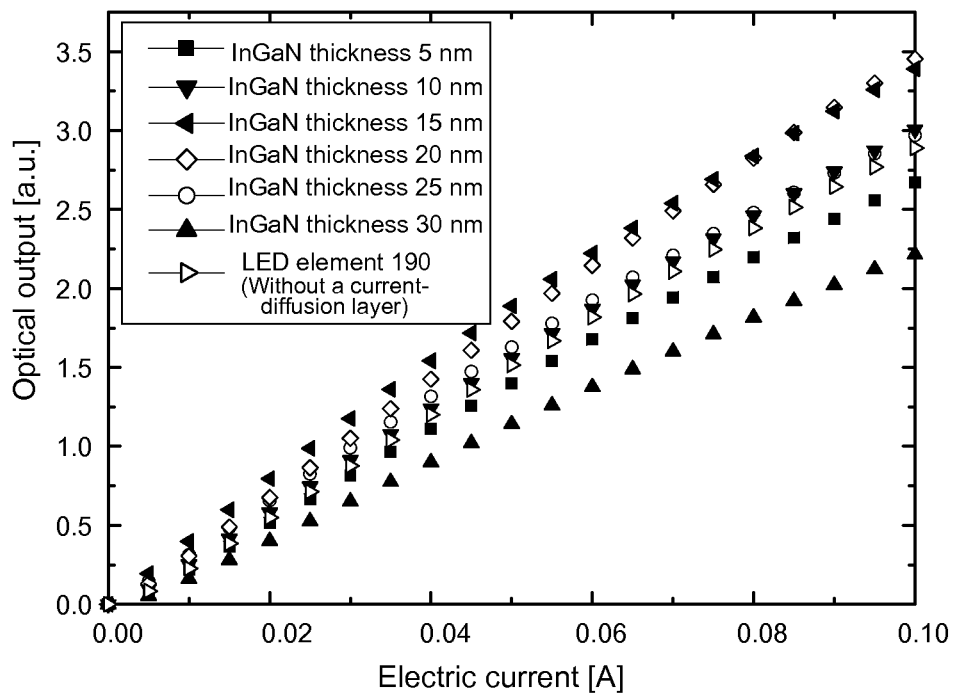
FIG. 4 is a graph showing a relationship between the electric current flowing in the active layer and the optical output obtained from the LED element when the thickness of $In_xGa_{1-x}N$ is changed.
FIG. 5 is a table showing a relationship between the thickness of $In_yGa_{1-y}N$ and the yield of the LED element.

FIG. 4 is a graph showing a relationship between the electric current flowing in the active layer and the optical output obtained from the LED element when the thickness of InGaN is changed. Here, the In composition has been set to be 2%. According to FIG. 4, it will be understood that, when the thickness of InGaN is 10 nm, an optical output equivalent to that of the conventional LED element 190 that is not provided with the current-diffusion layer 103 is obtained and, when the thickness of InGaN is set to be 15 nm, 20 nm, or 25 nm, an optical output higher than that of the conventional case is obtained. Here, when the thickness of InGaN is set to be 15 nm, the highest optical output is obtained in a wide range of the applied electric current value.

On the other hand, when the thickness of InGaN is set to be 30 nm, the optical output decreases as compared with the conventional LED element 190. This seems to be due to the following reason. When the thickness is set to be 30 nm, crystal defects due to the above-described lattice relaxation are generated, and the uniformity of the electric current within the plane decreases, whereby the optical output decreases.

Here, also in the case in which the thickness of InGaN is set to be 5 nm which is smaller than 10 nm, the optical output decreases as compared with the conventional LED element 190, as shown in FIG. 4. This seems to be due to the following reason. As described above with reference to FIG. 3B, by largely receiving the influence of the piezoelectric field, an inclination is generated also in the approximately flat band region 142 formed by InGaN, and the ability of accumulating the electrons has decreased.

From the above, it will be understood that an effect of improving the optical output of the LED element 101 is obtained by setting the thickness of InGaN to be 10 nm or more and 25 nm or less.

Further, by increasing the thickness of InGaN, the voltage-resistance characteristics of the LED element itself are improved, whereby an effect of improving the yield is obtained. FIG. 5 is a table showing a relationship between the thickness of InGaN and the yield of the LED element.

LED elements 101 were fabricated in which the thickness of the third semiconductor layer (InGaN) were varied to be 3 nm, 5 nm, 10 nm, and 20 nm while fixing the thickness of the fourth semiconductor layer (here, AlGaN) constituting the current-diffusion layer 103 to be 20 nm. Then, after applying a forward voltage and a backward voltage of 500 V, respectively, to each of the LED elements 101, a backward current that flows when −5 V is applied as a backward bias is measured. At this time, the elements in which the absolute value of the backward current was 5 μA or less (or less than 5 μA) were regarded as good elements, and the elements in which the absolute value of the backward current exceeded 5 μA were regarded as poor elements, so as to determine the yield.

According to FIG. 5, the element in which the thickness of InGaN had the largest value of 20 nm gave the highest yield, and the element in which the thickness of InGaN had the smallest value of 3 nm gave the lowest yield. Here, according as the thickness of InGaN is sequentially increased to be 3 nm, 5 nm, 10 nm, and 20 nm, the yield increased. When the thickness of InGaN is 10 nm or more, the tendency of increase in the yield slows down.

The reason why such a phenomenon occurred seems to be that, when the thickness of the third semiconductor layer (InGaN) constituting the current-diffusion layer 103 is increased, the two-dimensional electron gas layer is more liable to be generated between the third semiconductor layer (InGaN) and the fourth semiconductor layer (AlGaN). As described above, the two-dimensional electron gas layer produces an effect of horizontally spreading the electric current. In accordance therewith, the electric current becomes less likely to be concentrated in a narrow region, and the electric field is alleviated. Consequently, even when a high voltage is momentarily applied, the electric field is diffused in the current-diffusion layer 103 and, as a result of this, the electric field is less likely to be concentrated, whereby breakage of the element is less likely to occur.

(Studies on the Si-Doping Concentration of Fourth Semiconductor)

Figure 6:
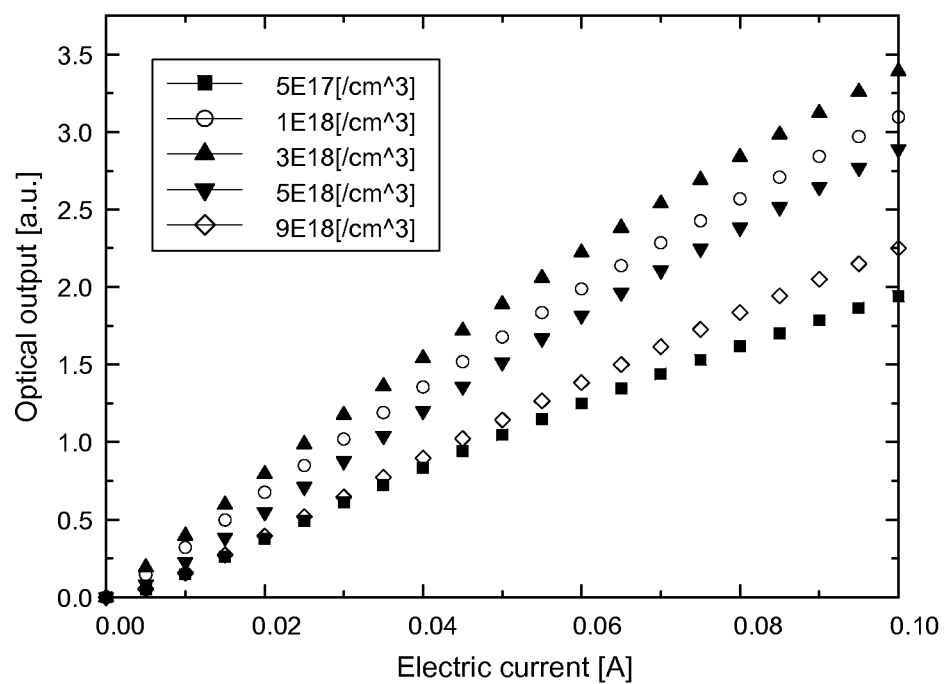
FIG. 6 is a graph showing a relationship between the electric current flowing in the active layer and the optical output obtained from the LED element when the Si-doping concentration of AlGaN is changed.

FIG. 6 is a graph showing a relationship between the electric current flowing in the active layer and the optical output obtained from the LED element when the Si-doping concentration of the fourth semiconductor (AlGaN) constituting the current-diffusion layer 103 is changed. Here, the In composition of InGaN was set to be 2%, and the thickness was set to be 15 nm.

According to FIG. 6, the highest optical output is exhibited when the Si-doping concentration is $3\times10^{18}$ (/cm$^3$). Also, it will be understood that a higher optical output than that of the conventional LED element 190 is exhibited in each of the cases of $1\times10^{18}$ (/cm$^3$), $3\times10^{18}$ (/cm$^3$), and $5\times10^{18}$ (/cm$^3$) (See FIG. 4). On the other hand, it will be understood that the optical output decreases as compared with that of the conventional LED element 190 in the case in which the Si-doping concentration is $5\times10^{17}$ (/cm$^3$) which is lower than $1\times10^{18}$ (/cm$^3$) and in the case in which the Si-doping concentration is $9\times10^{18}$ (/cm$^3$) which is higher than $5\times10^{18}$ (/cm$^3$) (See FIG. 4).

This seems to be due to the following reasons. In the case in which the Si-doping concentration of AlGaN is $5\times10^{17}$ (/cm$^3$), non-uniformity of Si is generated within the active layer 117 because the absolute Si concentration is low, whereby the optical output decreases. On the other hand, in the case in which the Si-doping concentration of AlGaN is $9\times10^{18}$ (/cm$^3$), a so-called droop phenomenon is generated in which the light-emission recombination probability decreases due to the overflow of electrons, and the internal light-emission efficiency is deteriorated, whereby the optical output decreases.

From the above, it will be understood that an effect of further improving the optical output of the LED element 101 is obtained by setting the Si concentration of AlGaN constituting the current-diffusion layer 103 to be $1\times10^{18}$ (/cm$^3$) or more and $5\times10^{18}$ (/cm$^3$) or less.

The screening effect of the conduction band 130 will be described with reference to FIG. 7. FIG. 7(*a*) is a model view showing the conduction band 130 of the current-diffusion layer 103 when AlGaN constituting the current-diffusion layer 103 is not doped with Si, and FIG. 7(*b*) is a model view showing the conduction band 130 of the current-diffusion layer 103 when the Si-doping concentration of AlGaN constituting the current-diffusion layer 103 is set to be $3\times10^{18}$ (/cm$^3$).

As described above, when a crystal of AlGaN constituting the n-type cladding layer 115 is grown on the c-plane of the GaN crystal constituting the undoped layer 113, a piezoelectric field is generated based on the lattice constant difference. Due to this electric field, an inclination is generated (region 151) in the conduction band 130 formed by n-AlGaN constituting the n-type cladding layer 115 and the AlGaN layer and the InGaN layer constituting the current-diffusion layer 103. The presence of this inclination hinders the movement of electrons to the p-layer side (right side in the Figure). On the other hand, when the AlGaN layer is doped with Si, the electric field acts in the direction of cancelling the piezoelectric field, so that an effect of pressing the conduction band 130 down is produced. As a result of this, the inclination of the conduction band 130 is alleviated (region 152), thereby facilitating the injection of electrons from the n-layer side to the band-bending region 141 and the approximately flat band region 142.

In particular, in the case of designing the LED element 101 as a high-injection device of about 100 A/cm$^2$, it is preferable to adopt a construction capable of injecting more electrons. From this result also, it is preferable to set the Si concentration in doping the AlGaN layer to be high. However, when the Si-doping concentration is set to be too high, a droop phenomenon occurs as described above. Therefore, the optical output can be improved by setting the Si-doping concentration to be $1\times10^{18}/cm^3$ or more and $5\times10^{18}/cm^3$ or less.

[Method of Producing LED Element 101]

Next, a method of producing the LED element 101 of the present invention will be described. Here, the production conditions and the dimensions such as the thickness in the following description of the production method are merely examples, so that the present invention is not limited to these numerical values.

<Step S1>

First, an undoped layer 113 is formed on a support substrate 111. For example, this is carried out through the following steps.

(Preparation of Support Substrate 111)

When a sapphire substrate is to be used as the support substrate 111, cleaning of a c-plane sapphire substrate is carried out. More specifically, this cleaning is carried out, for example, by placing the c-plane sapphire substrate in a processing furnace of an MOCVD (Metal Organic Chemical Vapor Deposition: organic metal chemical gas-phase vapor deposition) apparatus and raising the temperature within the furnace to be, for example, 1150° C. while allowing a hydrogen gas to flow at a flow rate of 10 slm in the processing furnace.

(Forming Undoped Layer 113)

Next, a low-temperature buffer layer made of GaN is formed on the surface of the support substrate 111 (c-plane sapphire substrate), and further an underlayer made of GaN is formed on top thereof. The low-temperature buffer layer and the underlayer correspond to the undoped layer 113.

A more specific method of forming the undoped layer 113 is, for example, as follows. First, the pressure within the furnace of the MOCVD apparatus is set to be 100 kPa, and the temperature within the furnace is set to be 480° C. Then, trimethylgallium (TMG) having a flow rate of 50 µmol/min and ammonia having a flow rate of 250000 µmol/min are supplied as source material gases for 68 seconds into the processing furnace while allowing a nitrogen gas and a hydrogen gas each having a flow rate of 5 slm to flow as carrier gases in the processing furnace. By this process, the low-temperature buffer layer made of GaN and having a thickness of 20 nm is formed on the surface of the support substrate 111.

Next, the temperature within the furnace of the MOCVD apparatus is raised to 1150° C. Then, TMG having a flow rate of 100 µmol/min and ammonia having a flow rate of 250000 µmol/min are supplied as source material gases for 30 minutes into the processing furnace while allowing a nitrogen gas having a flow rate of 20 slm and a hydrogen gas having a flow rate of 15 slm to flow as carrier gases in the processing furnace. By this process, the underlayer made of GaN and having a thickness of 1.7 µm is formed on the surface of the first buffer layer.

<Step S2>

Next, an n-type cladding layer 115 constituted of n-$Al_nGa_{1-n}N$ (0<n≤1) is formed on top of the undoped layer 113.

A more specific method of forming the n-type cladding layer 115 is, for example, as follows. First, the pressure within the furnace of the MOCVD apparatus is set to be 30 kPa. Then, TMG having a flow rate of 94 µmol/min, trimethylaluminum (TMA) having a flow rate of 6 µmol/min, ammonia having a flow rate of 250000 µmol/min, and tetraethylsilane having a flow rate of 0.025 µmol/min are supplied as source material gases for 30 minutes into the processing furnace while allowing a nitrogen gas having a flow rate of 20 slm and a hydrogen gas having a flow rate of 15 slm to flow as carrier gases in the processing furnace. By this process, a high-concentration electron supply layer having a composition of $Al_{0.06}Ga_{0.94}N$ with an Si concentration of $3\times10^{19}/cm^3$ and a thickness of 1.7 µm is formed on top of the undoped layer 113. In other words, by this process, the n-type cladding layer 115 having the high-concentration electron supply layer with an Si concentration of $3\times10^{19}/cm^3$ and a thickness of 1.7 µm is formed at least with respect to the region of the upper surface.

Here, the description has been given assuming that silicon (Si) is to be used as the n-type impurity contained in the n-type cladding layer 115; however, germanium (Ge), sulfur (S), selenium (Se), tin (Sn), tellurium (Te), and others may be used as well. Among these, silicon (Si) is especially preferable.

<Step S3>

Next, a current-diffusion layer 103 is formed on top of the n-type cladding layer 115 by forming a third semiconductor layer made of $In_xGa_{1-x}N$ (0<x≤0.05) and a fourth semiconductor layer made of n-$Al_yGa_{1-y}N$ (0<y≤1).

A more specific method of forming the current-diffusion layer 103 is, for example, as follows. First, the pressure within the furnace of the MOCVD apparatus is set to be 100 kPa, and the temperature within the furnace is set to be 830° C. Then, a step of supplying TMG having a flow rate of 10 µmol/min, trimethylindium (TMI) having a flow rate of 12 µmol/min, and ammonia having a flow rate of 300000 µmol/min as source material gases for 360 seconds into the processing furnace is carried out while allowing a nitrogen gas having a flow rate of 15 slm and a hydrogen gas having a flow rate of 1 slm to flow as carrier gases in the processing furnace. Thereafter, a step of supplying TMG having a flow rate of 10 µmol/min, TMA having a flow rate of 1.6 µmol/min, tetraethylsilane having a flow rate of 0.009 µmol/min, and ammonia having a flow rate of 300000 µmol/min for 360 seconds into the processing furnace is carried out. By this process, the current-diffusion layer 103 made of InGaN having a thickness of 15 nm and n-AlGaN having a thickness of 20 nm is formed.

<Step S4>

Next, an active layer 117 having a multiquantum well structure made by repetition of a well layer made of $In_aGa_{1-a}N$ (0<a≤1) and a barrier layer made of $Al_bGa_{1-b}N$ (0<b≤1) is formed on top of the current-diffusion layer 103.

A more specific method of forming the active layer 117 is, for example, as follows. First, the pressure within the furnace of the MOCVD apparatus is set to be 100 kPa, and the temperature within the furnace is set to be 830° C. Then, a step of supplying TMG having a flow rate of 10 µmol/min, TMI having a flow rate of 12 µmol/min, and ammonia having a flow rate of 300000 µmol/min as source material gases for 48 seconds into the processing furnace is carried out while allowing a nitrogen gas having a flow rate of 15 slm and a hydrogen gas having a flow rate of 1 slm to flow as carrier gases in the processing furnace. Thereafter, a step of supplying TMG having a flow rate of 10 µmol/min, TMA having a flow rate of 1.6 µmol/min, tetraethylsilane having a flow rate of 0.002 µmol/min, and ammonia having a flow rate of 300000 µmol/min for 120 seconds into the processing furnace is carried out. Thereafter, by repeating these two steps, the active layer 117 having a multiquantum well structure of 5 periods by the well layer made of InGaN having a thickness of 2 nm and the bather layer made of n-AlGaN having a thickness of 7 nm is formed on top of the current-diffusion layer 103.

<Step S5>

Next, a p-type cladding layer 119 constituted of p-Al$_c$Ga$_{1-c}$N (0<c≤1) is formed on top of the active layer 117, and further a high-concentration p-type contact layer 121 is formed on top thereof.

A more specific method of forming the p-type cladding layer 119 and the p-type contact layer 121 is, for example, as follows. First, the pressure within the furnace of the MOCVD apparatus is maintained to be 100 kPa, and the temperature within the furnace is raised to 1050° C. while allowing a nitrogen gas having a flow rate of 15 slm and a hydrogen gas having a flow rate of 25 slm to flow as carrier gases in the processing furnace. Thereafter, TMG having a flow rate of 35 TMA having a flow rate of 20 µmol/min, ammonia having a flow rate of 250000 µmol/min, and biscyclopentadienylmagnesium (Cp$_2$Mg) having a flow rate of 0.1 µmol/min are supplied as source material gases for 60 seconds into the processing furnace. By this process, a hole supply layer having a composition of Al$_{0.3}$Ga$_{0.7}$N and a thickness of 20 nm is formed on the surface of the active layer 117. Thereafter, by changing the flow rate of TMA to 9 µmol/min and supplying the source material gases for 360 seconds, a hole supply layer having a composition of Al$_{0.07}$Ga$_{0.93}$N and a thickness of 120 nm is formed. The p-type cladding layer 119 is formed by these hole supply layers.

Further thereafter, the supply of TMA is stopped, and the flow rate of Cp$_2$Mg is changed to 0.2 µmol/min, so as to supply the source material gases for 20 seconds. By this process, the p-type contact layer 121 made of p-GaN and having a thickness of 5 nm is formed.

Here, the description has been given assuming that magnesium (Mg) is to be used as the p-type impurity contained in the p-type cladding layer 119 and the p-type contact layer 121; however, beryllium (Be), zinc (Zn), carbon (C), and others may be used as well.

<Step S6>

Next, an activation process is carried out on the wafer obtained through the steps S1 to S5. More specifically, an activation process of 15 minutes at 650° C. in a nitrogen atmosphere is carried out using an RTA (Rapid Thermal Anneal: rapid heating) apparatus.

Thereafter, in the case of achieving a LED element of longitudinal type, the support substrate 111 is peeled off, and thereafter, an electrode is formed at the site where the support substrate 111 was present, so as to form an n-side electrode. Alternatively, in the case of achieving a LED element of lateral type, etching is carried out from the p-side until the n-type semiconductor layer is exposed, and an n-side electrode is formed. Here, in this case, an electrode such as a transparent electrode may be formed in accordance with the needs. Thereafter, a power supply terminal and the like are formed on each electrode. Then, in accordance with the needs, the exposed element side surface and top surface are covered with an insulating layer having a high light transmittance, and connection to a substrate is implemented by wire bonding or the like.

OTHER EMBODIMENTS

Hereafter, other embodiments of the first embodiment will be described.

Figure 8A:
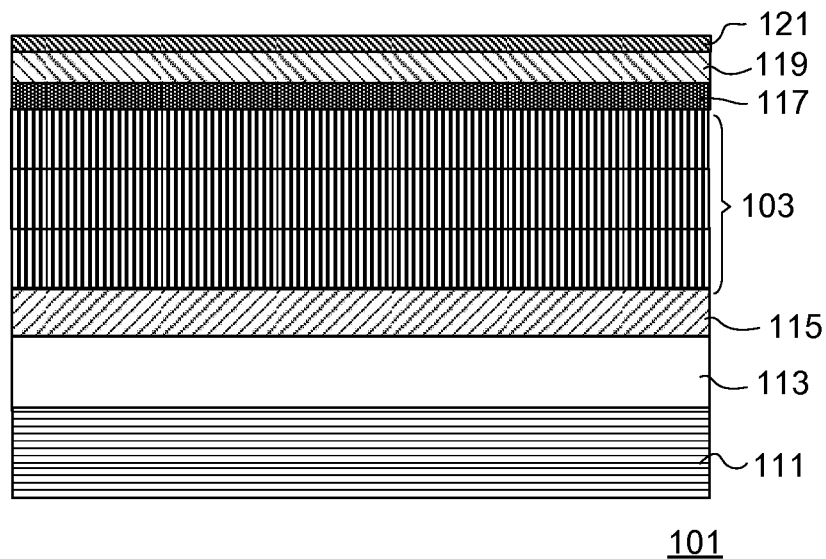
FIG. 8A is a schematic sectional view showing another structure of an LED element according to the present invention.

<1> In the LED element 101, the hetero-structure having the layer made of In$_x$Ga$_{1-x}$N (0<x≤0.05) and the layer made of n-Al$_{y1}$Ga$_{y2}$In$_{y3}$N (0<y1<1, 0<y2<1, 0≤y3≤0.05, y1+y2+y3=1) may be repetitively formed for a plurality of times to construct the current-diffusion layer 103 (See FIG. 8A).

Figure 8B:
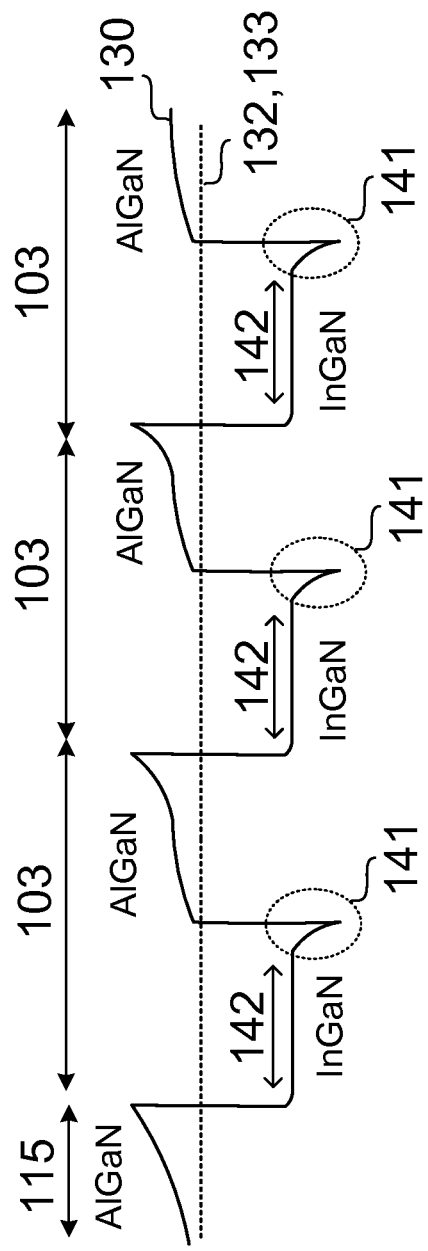
FIG. 8B is a model view of the energy band diagram of the conduction band of the current-diffusion layer in the construction of FIG. 8A by reflecting the interaction of the semiconductor materials.

Also, FIG. 8B is a model view of the energy band diagram of the conduction band of the current-diffusion layer 103 in the construction of FIG. 8A, drawn in the same manner as in FIG. 3C.

By adopting a construction such as shown in FIG. 8A, a plurality of band-bending regions 141 playing a role of horizontally spreading the electric current and a plurality of approximately flat band regions 142 functioning to accumulate electrons can be provided, thereby further improving the effect of current spreading as compared with the construction of FIG. 1. This can further enhance the optical output.

Here, the current-diffusion layer 103 may be constructed in such a manner that In$_x$Ga$_{1-x}$N and n-Al$_{y1}$Ga$_{y2}$In$_{y3}$N are periodically formed from the side nearest to the n-type cladding layer 115. Conversely, the current-diffusion layer 103 may be constructed in such a manner that n-Al$_{y1}$Ga$_{y2}$In$_{y3}$N and In$_x$Ga$_{1-x}$N are periodically formed from the side nearest to the n-type cladding layer 115. Referring to FIGS. 8A and 8B, in the case in which a plurality of semiconductor layers are periodically formed to construct the current-diffusion layer 103, the layer formed at the position nearest to the n-type cladding layer and the layer formed at the position nearest to the p-type cladding layer may be either In$_x$Ga$_{1-x}$N or n-Al$_{y1}$Ga$_{y2}$In$_{y3}$N.

Figure 9:
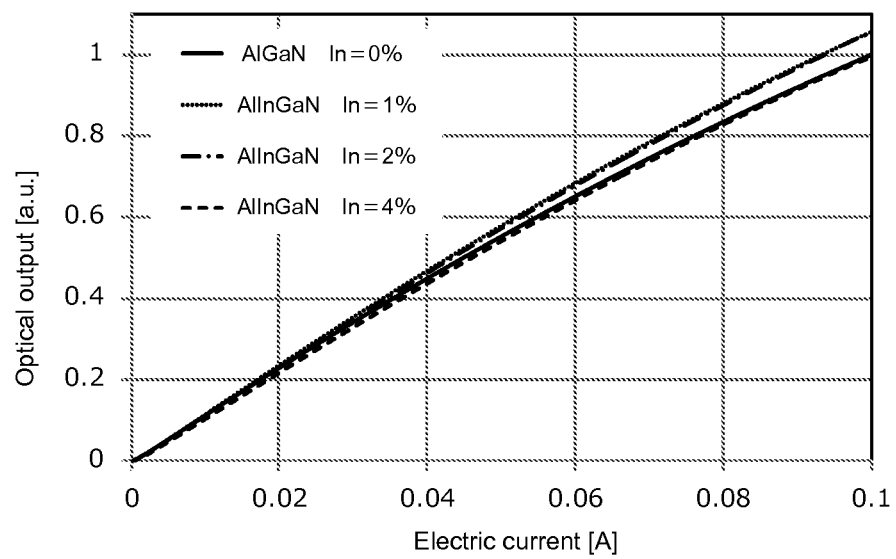
FIG. 9 is a graph showing a relationship between the optical output and the electric current supplied to the LED element that has been fabricated by varying the In composition contained in the fourth semiconductor layer.

<2> In the above-described embodiment, description has been given assuming that the fourth semiconductor layer constituting the current-diffusion layer 103 is n-AlGaN; however, the fourth semiconductor layer may be constituted of n-Al$_{y1}$Ga$_{y2}$In$_{y3}$N (0<y1<1, 0<y2<1, 0≤y3≤0.05, y1+y2+y3=1) obtained by addition of In in a composition within a range of 5% or less. FIG. 9 is a graph showing a relationship between the optical output and the electric current supplied to the LED element that has been fabricated by varying the In composition contained in the fourth semiconductor layer. The value of the optical output indicated by the longitudinal axis of FIG. 9 is defined as a value relative to the optical output when a current of 0.1 A is supplied to the LED element in which the fourth semiconductor layer has been formed of n-AlGaN that does not contain In.

Here, a method of allowing In to be contained in the fourth semiconductor layer may be achieved in such a manner that, in performing the step of supplying TMG, TMA, tetraethylsilane, and ammonia in the above-described step S3, TMI is supplied at a predetermined flow rate together with these gases.

According to FIG. 9, it will be understood that, in the case in which In was allowed to be contained at 4% in the fourth semiconductor layer, the obtained optical output was not so much different from that of the case in which the fourth semiconductor layer had been constructed without allowing In to be contained. Also, in the case in which In was allowed to be contained at 1% in the fourth semiconductor layer and in the case in which In was allowed to be contained at 2% in the fourth semiconductor layer, the obtained optical output was improved as compared with the case in which the fourth semiconductor layer had been constructed without allowing In to be contained. This seems to be due to the fact that, by allowing In to be contained in AlGaN, the distortion generated by the lattice mismatch of AlGa(In)N and InGaN was alleviated, and the surface state thereof was improved.

However, when In is allowed to be contained too excessively in the fourth semiconductor layer, there is a fear of raising a problem such that the overflow of electrons becomes conspicuous because the energy barrier to the InGaN layer becomes low and a problem such that the effect of the two-dimensional electron gas decreases due to reduction of the piezo electrode. FIG. 9 shows that the case in which the content of In in the fourth semiconductor layer is 4% gives an optical output almost equivalent to that of the case in which In is not contained. However, it has been confirmed that, even in the case in which the content is about 5%, the difference is not so large. However, when the composition of In exceeds 5%, the optical output decreases significantly as compared with the case in which the fourth semiconductor layer is constructed with AlGaN that does not contain In, due to the above-described reasons. Therefore, the composition of In that is allowed to be contained in the fourth semiconductor layer is preferably 0% or more and 5% or less.

Second Embodiment

Figure 10:
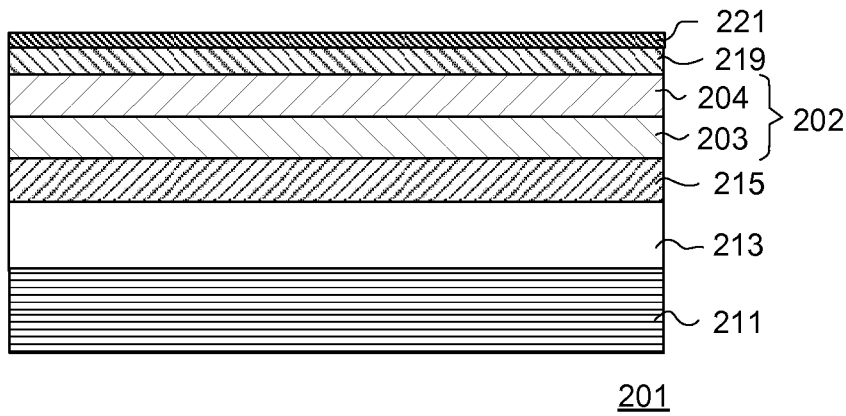
FIG. 10 is a schematic sectional view showing a structure of an LED element according to the present invention.
Figure 24:
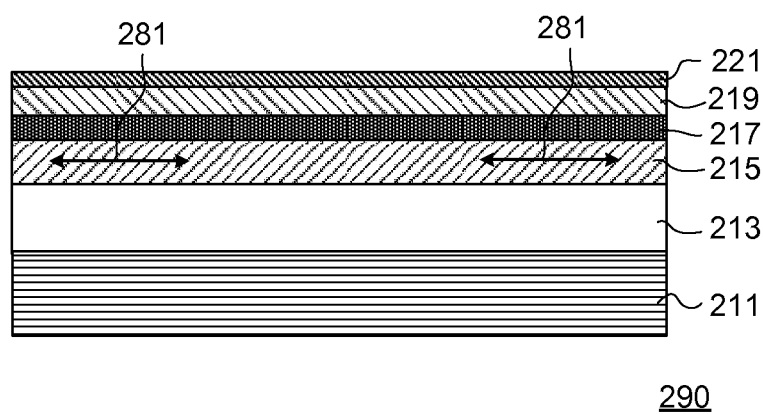
FIG. 24 is a schematic sectional view showing a structure of a conventional LED element.

The second embodiment of the present invention will be described.
[Structure]
FIG. 10 is a schematic sectional view showing a structure of an LED element 201 according to the present invention. Here, constituent elements identical to those of the LED element 290 shown in FIG. 24 are denoted with identical reference symbols. Also, in each of the following drawings, the dimension ratio in the Figures does not necessarily coincide with the actual dimension ratio.

Compared with the LED element 290, the LED element 201 is different in that a hetero-structure 202 is provided in place of the active layer 217.

The LED element 201 has an undoped layer 213 on top of a support substrate 211 made of sapphire or the like, and has an n-type cladding layer 215 (corresponding to the "fifth semiconductor layer") on top thereof. Further, the LED element 201 has a hetero-structure 202 formed of a lamination structure of an n-$Al_{x1}Ga_{x2}In_{x3}N$ layer 203 (corresponding to the "sixth semiconductor layer") and an $In_yGa_{1-y}N$ layer 204 (corresponding to the "seventh semiconductor layer") on top of the n-type cladding layer 215. The LED element 201 has a construction of being provided with a p-type cladding layer 219 (corresponding to the "eighth semiconductor layer") and a p-type contact layer 221 on top of the hetero-structure 202. Also, in the same manner as in the LED element 290, the LED element 201 has a last barrier layer (not illustrated in the drawings) in accordance with the needs between the hetero-structure 202 and the p-type cladding layer 219. Here, the following relationships are satisfied: $0<x1<1$, $0<x2<1$, $0 \leq x3 \leq 0.05$, $x1+x2+x3=1$ in the sixth semiconductor layer.

(Support Substrate 211)
The support substrate 211 is constituted of a sapphire substrate. Here, besides sapphire, the support substrate 211 may be constituted of Si, SiC, GaN, YAG, or the like.

(Undoped Layer 213)
The undoped layer 213 is formed of GaN. More specifically, the undoped layer 213 is formed of a low-temperature buffer layer made of GaN and an underlayer made of GaN on top thereof.

(n-Type Cladding Layer 215)
The n-type cladding layer 215 is constituted of n-$Al_nGa_{1-n}N$ ($0<n<1$). Here, the n-type cladding layer 215 may be constructed to include a layer (protective layer) constituted of n-GaN in a region that is in contact with the undoped layer 213. In this case, the protective layer is doped with an n-type impurity such as Si, Ge, S, Se, Sn, or Te, and in particular is preferably doped with Si.

Here, in the present embodiment, the n-type cladding layer 215 is formed of n-$Al_{0.1}Ga_{0.9}N$ as one example.

(p-Type Cladding Layer 219)
The p-type cladding layer 219 is constituted, for example, of p-$Al_cGa_{1-c}N$ ($0<c \leq 1$) and is doped with a p-type impurity such as Mg, Be, Zn, or C. In the present embodiment, the p-type cladding layer 219 is formed of a lamination structure of p-$Al_{0.3}Ga_{0.7}N$ and p-$Al_{0.07}Ga_{0.93}N$. Here, the p-type cladding layer 219 may be constructed to include a layer (protective layer) constituted of GaN in a region that is in contact with the p-type contact layer 221. In this case, the protective layer is doped with a p-type impurity such as Mg, Be, Zn, or C.

(p-Type Contact Layer 221)
The p-type contact layer 221 is constituted, for example, of p-GaN. In particular, the p-type contact layer 221 is constituted of a $p^+$-GaN layer doped with a p-type impurity such as Mg, Be, Zn, or C at a high concentration.

(Hetero-Structure 202)
As described above, the hetero-structure 202 is formed of the lamination structure of the n-$Al_{x1}Ga_{x2}In_{x3}N$ layer 203 and the $In_yGa_{1-y}N$ layer 204.

Here, the n-$Al_{x1}Ga_{x2}In_{x3}N$ layer 203 is constructed to have an Si-doping concentration of $1 \times 10^{18}/cm^3$ or more and $1 \times 10^{19}/cm^3$ or less. Also, the $In_yGa_{1-y}N$ layer 204 is constructed to have a thickness of 10 nm or more and 25 nm or less, and is constructed to have an In composition ratio such that the peak light-emission wavelength of the LED element 201 will be 362 nm or more and 395 nm or less.
[Different Construction]
Referring to FIG. 11, the LED element 201 may have a construction of being provided with a multilayer structure part 202A obtained by repetition of the hetero-structure 202 for a plurality of periods. In this case, the LED element 201 has a construction of being provided with the p-type cladding layer 219 and the p-type contact layer 221 on top of the $In_yGa_{1-y}N$ layer 204 located at the topmost layer of the multilayer structure part 202A. Also, in this case, the LED element 201 may have a last barrier layer (not illustrated in the drawings) in accordance with the needs between the $In_yGa_{1-y}N$ layer 204 located at the topmost layer of the multilayer structure part 202A and the p-type cladding layer 219.

Also, the positional relationship of the n-$Al_{x1}Ga_{x2}In_{x3}N$ layer 203 and the $In_yGa_{1-y}N$ layer 204 constituting the hetero-structure 202 may be such that either of the two is positioned at an upper layer and the other is positioned at a lower layer as long as these are alternately laminated. For example, in the case of a construction of being provided with the multilayer structure part 202A obtained by repetition of the hetero-structure 202 for a plurality of periods, a construction may be adopted in which the n-$Al_{x1}Ga_{x2}In_{x3}N$ layer 203 is laminated on top of the $In_yGa_{1-y}N$ layer 204, as shown in FIG. 12. Here, FIGS. 11 and 12 each disclose a construction of being provided with the multilayer structure part 202A obtained by repeated lamination of the hetero-structure 202 for three periods; however, the number of repetition periods is not limited to three. For example, the number of repetition periods may be five or any other number.
[Description of Function of Hetero-Structure 202]
Hereafter, improvement in the light-emission efficiency of the LED element 201, as compared with the conventional LED element 290, brought about by being provided with the hetero-structure 202 having the above construction will be described with reference to Examples. Here, in the following description, the description will be given assuming that the In composition contained in the sixth semiconductor layer is 0% (x3=0); however, similar arguments can be made even with the sixth semiconductor layer containing In within a range of 5%. At this time, the sixth semiconductor layer will be denoted as "n-Al$_x$Ga$_{1-x}$N layer 203" at appropriate times; however, this is equivalent to a case of x3=0 in the case in which the sixth semiconductor layer is constituted of n-Al$_{x1}$Ga$_{x2}$In$_{x3}$N (0<x1<1, 0<x2<1, 0≤x3≤0.05, x1+x2+x3=1).

Here, in the following description, the LED element 290 used for comparison and verification was formed in such a manner that an active layer 217 formed by MQW was made by alternate lamination of InGaN having a thickness of 2 nm and AlGaN having a thickness of 5 nm for 5 periods.

(Studies on Peak Light-Emission Wavelength)

Figure 12:
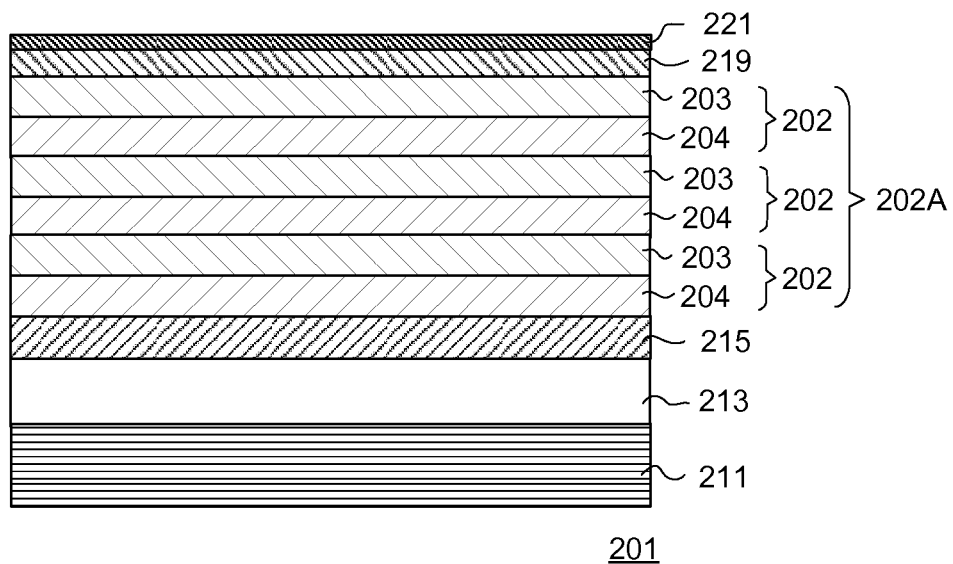
FIG. 12 is a schematic sectional view showing another structure of an LED element according to the present invention.
Figure 13:
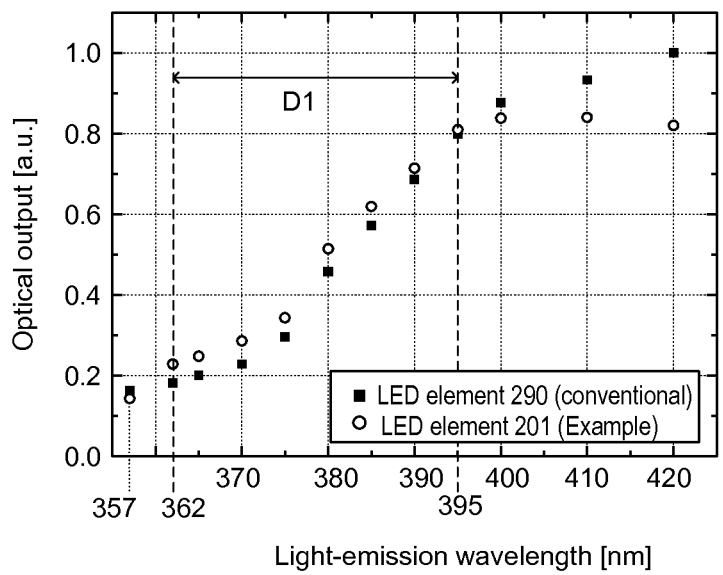
FIG. 13 is a graph showing a relationship between the peak light-emission wavelength of the LED element and the optical output obtained from the LED element when the peak light-emission wavelength of the element is changed by changing the In composition of the $In_yGa_{1-y}N$ layer.

FIG. 13 is a graph showing a relationship between the peak light-emission wavelength of the LED element 201 and the optical output when the In composition, that is, the y-value, of the In$_y$Ga$_{1-y}$N layer 204 constituting the hetero-structure 202 was changed. Here, as the LED element 201, a structure was adopted in which the In$_y$Ga$_{1-y}$N layer 204 having a thickness of 15 nm was formed on top of the n-type cladding layer 215, and the hetero-structure 202 made by forming the n-Al$_x$Ga$_{1-x}$N layer 203 having a thickness of 20 nm on top of the In$_y$Ga$_{1-y}$N layer 204 was repeated for five periods (See FIG. 12). Also, for comparison, data of the conventional LED element 290 that was not provided with the hetero-structure 202 are shown. As described above, this LED element 290 had a construction in which the active layer 217 was made by alternate lamination of InGaN having a thickness of 2 nm and AlGaN having a thickness of 5 nm for 5 periods.

Also, in FIG. 13, for both of the LED element 201 and the conventional LED element 290, an element of 350 μm square was used, and the optical output was measured when an electric current of 0.1 A was injected into this element. This corresponds to a case in which the current density of the element is set to be 100 A/cm$^2$. This current density corresponds to a value that is assumed to be a target in designing the element as a high-injection device. Here, the current density in designing an element as a low-injection device is about 20 to 30 A/cm$^2$.

From FIG. 13, it will be understood that, in the range D1 in which the light-emission wavelength is 362 nm or more and 395 nm or less, the LED element 201 of the present invention gives an improved optical output as compared with the conventional LED element 290. On the other hand, in the case in which the light-emission wavelength is 357 nm which is shorter than 362 nm and in the case in which the light-emission wavelength is 400 nm, 410 nm, or 420 nm which is longer than 395 nm, the conventional LED element 290 gives a higher optical output than that of the LED element 201. This result seems to suggest the following.

Figure 14A:
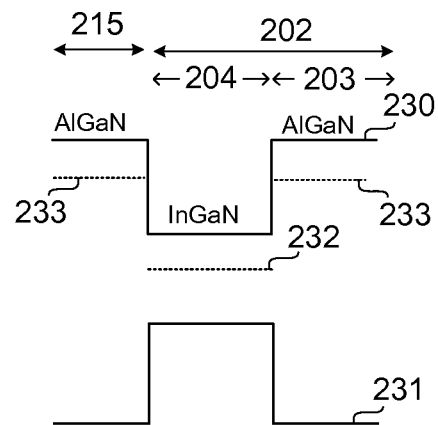
FIG. 14A is a model view showing an ideal energy band diagram of the hetero-structure.
Figure 14B:
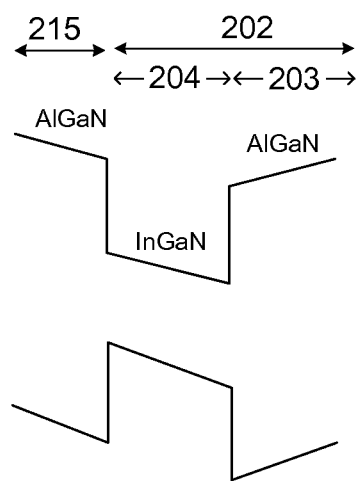
FIG. 14B is a model view showing the energy band diagram of the hetero-structure by reflecting the influence of the piezoelectric field.

FIGS. 14A and 14B are model views showing an energy band diagram of the hetero-structure 202. Here, in the following, the sixth semiconductor layer is denoted as "AlGaN", and the seventh semiconductor layer is denoted as "InGaN" when attention is not paid to the composition of each atom; however, this does not define that the ratio of atoms other than nitrogen is 1:1.

As compared with InGaN, AlGaN has a larger band gap. For this reason, an approximately flat band region by the InGaN layer 204 is formed between n-AlGaN constituting the n-type cladding layer 215 and the AlGaN layer 203 constituting the hetero-structure 202 when the influence of the polarization electric field described later is not considered, as shown in FIG. 14A. Here, as described before, in the present Example, the thickness of the InGaN layer 204 is set to be 15 nm, which is far larger than the thickness of 2 nm of InGaN constituting the active layer 217 of the conventional LED element 290. For this reason, the approximately flat band region is widely formed in the region of the InGaN layer 204.

Here, as will be described later with reference to different experiment results, the thickness of the InGaN layer 204 constituting the hetero-structure 202 included in the LED element 201 of the present invention is within a range of 10 nm or more and 25 nm or less, and is constructed to be far larger than that of InGaN having a thickness of about 2 nm included in the conventional LED element 290 in which the MQW is made of the active layer 217.

In the LED element 201, a piezoelectric polarization (piezo polarization) is generated in the c-axis direction perpendicular to the plane of the flat band region formed by the InGaN layer 204.

FIG. 14B is a model view showing the energy band of the hetero-structure 202 drawn by considering the influence of this piezoelectric field. By the piezoelectric field, a distortion is generated in the energy band.

When the distortion of the energy band increases, the overlap of wave functions of the electrons and holes decreases, whereby a so-called quantum Stark effect is generated in which the ratio of light emission brought about by recombination of electrons and holes decreases. This distortion increases according as the In composition ratio in the InGaN layer 204 increases. In the LED element 201 in which the peak light-emission wavelength is 400 nm or more, the optical output decreases as compared with the conventional LED element 290. This seems to be because the quantum Stark effect due to the high In composition ratio has become conspicuous. Also, it seems that the influence of the aforementioned misfit dislocation caused by the lattice constant difference cannot be ignored.

On the other hand, when it is attempted to achieve light in which the peak light-emission wavelength is 357 nm which is smaller than 360 nm, the In ratio of the In$_y$Ga$_{1-y}$N layer 204 must be reduced to be extremely small. In the case of the conventional LED element 290, the thickness of InGaN is about 2 nm, so that an addition of a small amount of In can be made, and it is possible to achieve an optimum In ratio for achieving light of a short wavelength of this degree. However, in the LED element 201 containing the In$_y$Ga$_{1-y}$N layer 204 having a thickness of 15 nm, the In content increases for the amount of the large thickness of the In$_y$Ga$_{1-y}$N layer 204, so that it is difficult to achieve light of a short wavelength of about 357 nm. Consequently, when a LED element having a peak light-emission wavelength of 357 nm is achieved, the optical output of the conventional LED element 290 is higher than that of the LED element 201.

In contrast, in the range D1 in which the peak light-emission wavelength is 362 nm or more and 395 nm or less, the optical output of the LED element 201 of the present invention is higher than that of the conventional LED element 290. This seems to be due to the following reasons.

Compared with the InGaN layer 204, the AlGaN layer 203 has a larger electronic band gap, as shown in FIG. 14A. FIG. 14A shows the conduction band 230 and the valence electron band 231 as well as the Fermi level 232 of the InGaN layer 204 and the Fermi level 233 of the AlGaN layer 203. Here, in FIG. 14A, the interaction between InGaN and AlGaN is not taken into consideration.

Figure 14C:
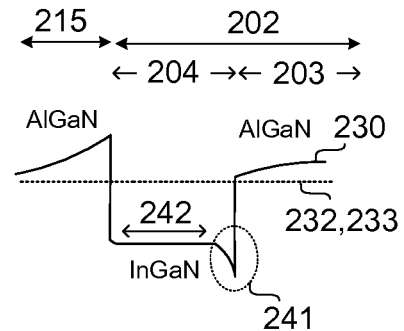
FIG. 14C is a model view showing the energy band diagram of the conduction band of the hetero-structure by reflecting the interaction of the semiconductor materials.

FIG. 14C is a model view showing the state of the conduction band 230 by reflecting the interaction of the two semiconductor materials. The Fermi levels 232 and 233 become equal to each other. However, due to the discontinuity of the energy bands of AlGaN and InGaN, the conduction band of the AlGaN layer 203 close to the p-layer is pulled downwards, whereby a band-bending region 241 is generated. In this band-bending region 241, a two-dimensional electron gas layer having a high horizontal mobility is formed. Also, as described above, by increasing the thickness of the InGaN layer 204, the approximately flat band region 242 is widened, and a large amount of electrons can be accumulated, so that the electrons do not overflow by crossing over the potential of the AlGaN layer 203 until the electrons are accumulated in the band-bending region 241 formed at the interface between the AlGaN layer 203 and the InGaN layer 204 and in the approximately flat band region 242 of the InGaN layer 204. In other words, horizontal electron movement is achieved and, as a result of this, horizontal current spreading can be achieved. In other words, a function of horizontally spreading the electric current (current-diffusing function) is achieved by the heterojunction between the InGaN layer 204 and the AlGaN layer 203.

From the above, it will be understood that the construction of the LED element 201 produces an effect such that, in the range in which the peak light-emission wavelength is 362 nm or more and 395 nm or less, the optical output is improved as compared with the conventional case.

Figure 11:
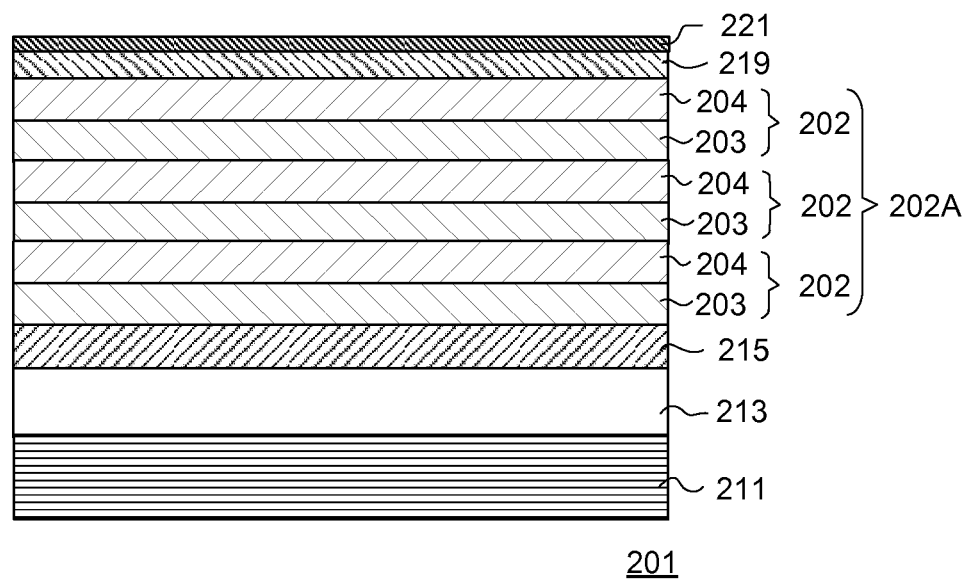
FIG. 11 is a schematic sectional view showing another structure of an LED element according to the present invention.
Figure 14D:
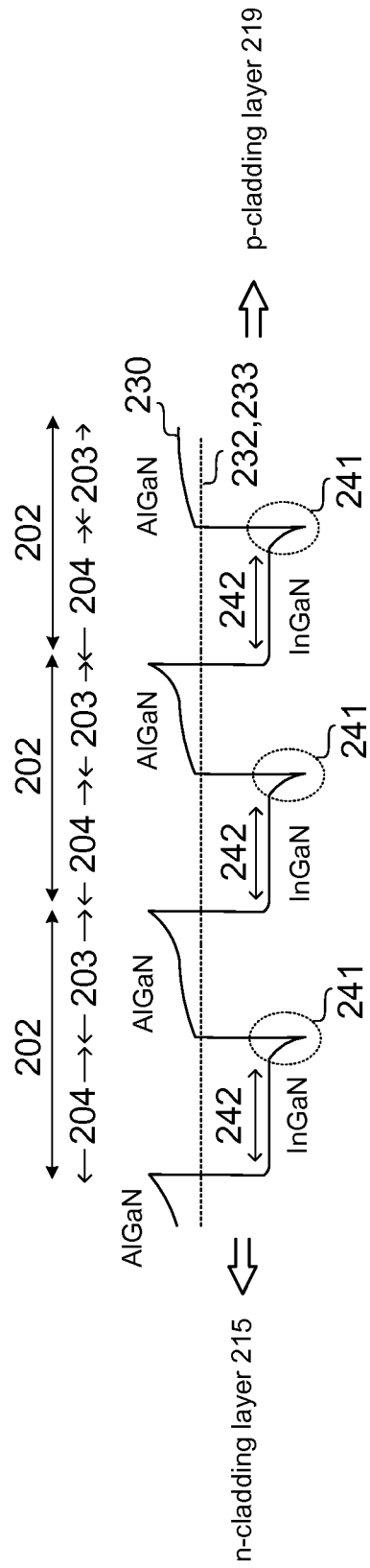
FIG. 14D is a model view showing the energy band diagram of the conduction band of the hetero-structure by reflecting the interaction of the semiconductor materials.

Here, in the case of a construction having the hetero-structure 202 for a plurality of periods as shown in FIGS. 11 and 12, similar arguments can be made by replacing the AlGaN layer 15 in FIGS. 14A to 14C with the AlGaN layer 203 constituting the hetero-structure 202 of the immediately previous period. FIG. 14D is a model view of the energy band diagram of the conduction band 230 of the hetero-structure 202 in the construction having the hetero-structure 202 for a plurality of periods (See FIGS. 11 and 12), drawn in the same manner as in FIG. 14C.

FIG. 14D shows that, by being provided with the hetero-structure 202 for a plurality of periods, a plurality of band-bending regions 241 playing a role of horizontally spreading the electric current and a plurality of approximately flat band regions 242 functioning to accumulate electrons can be provided. This can further improve the effect of current spreading.

Also, in particular, by increasing the thickness of the InGaN layer 204, the current spreading effect can be enhanced, and this further contributes to the improvement of the optical output. This will be described in the following.

(Studies on Thickness of the InGaN Layer 204)

As described above, because the InGaN layer 204 forms the approximately flat band region 242, it is preferable to increase the thickness of the InGaN layer 204 in order to enhance the capability of accumulating the electrons. However, due to the difference of the lattice constants of GaN and InGaN, a lattice relaxation occurs when the thickness of the InGaN layer 204 is increased to be too large. This results in that the electrons cannot be sufficiently accumulated in the band-bending region 241 and in the approximately flat band region 242.

Figure 15:
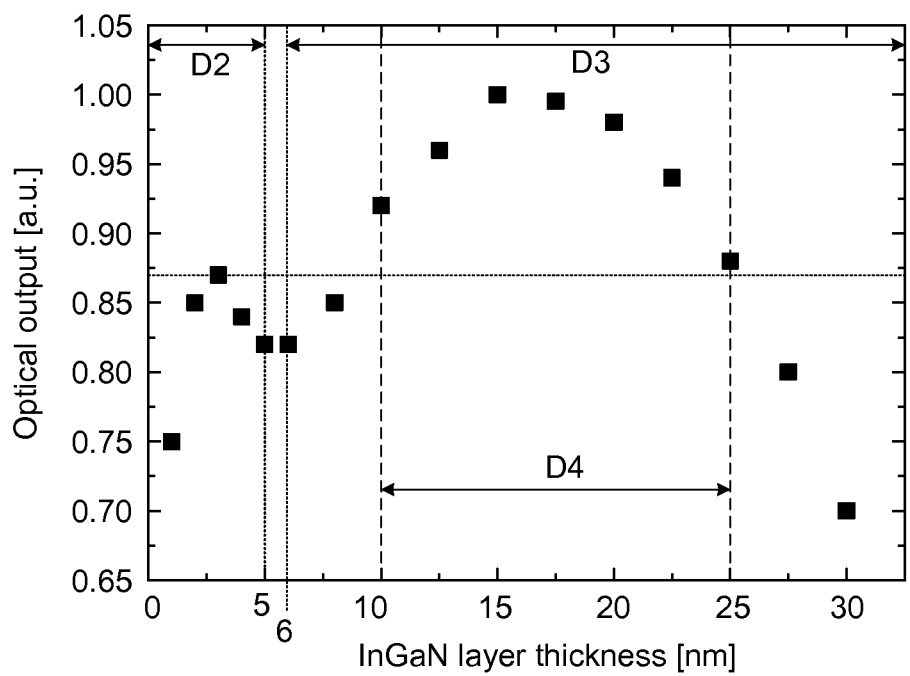
FIG. 15 is a graph showing a relationship between the electric current flowing in the LED element and the optical output obtained from the LED element when the thickness of the InGaN layer is changed.

FIG. 15 is a graph showing a relationship between the thickness and the obtained optical output when the thickness of the InGaN layer 204 is changed in the LED element 201. Here, the In ratio of the InGaN layer 204 was adjusted so that the peak light-emission wavelength would be 365 nm.

According to FIG. 15, it will be understood that the relationship between the optical output and the thickness changes in the region D2 in which the thickness of the InGaN layer 204 is 5 nm or less and in the region D3 in which the thickness is 6 nm or more. In other words, in the region D2, the peak is at the thickness of about 3 nm, and the optical output decreases when the thickness is larger than 3 nm. This region D2 is within the thickness range in which the light-emission recombination is prompted by using the quantum effect provided by what is known as a quantum well, and seems to be a region that contributes to light emission of the conventional LED element 290.

In contrast, in the region D3 in which the thickness is 6 nm or more, the optical output begins to rise again when the thickness of the InGaN layer 204 increases and, with the peak at the thickness of about 15 nm, the optical output begins to decrease when the thickness becomes larger than 15 nm. This region D3 seems to be within a thickness range in which light emission is prompted by the quantum effect using the band-bending region 241 of the heterojunction interface between the InGaN layer 204 and the AlGaN layer 203.

From FIG. 15, it will be understood that, as compared with the inside of the thickness range D2 that was conventionally used as the MQW construction, the optical output is improved, as compared with the conventional case, when the thickness of the InGaN layer 204 is set to be within a range (region D4) of 10 nm or more and 25 nm or less as the construction of the LED element 201. Here, it seems that, when the thickness of the InGaN layer 204 is set to be more than 25 nm as the construction of the LED element 201, the misfit dislocation due to the crystal defects caused by the above-described lattice relaxation becomes conspicuous, and the uniformity of the electric current within the plane decreases, whereby the optical output decreases as compared with the conventional construction.

Figure 16:
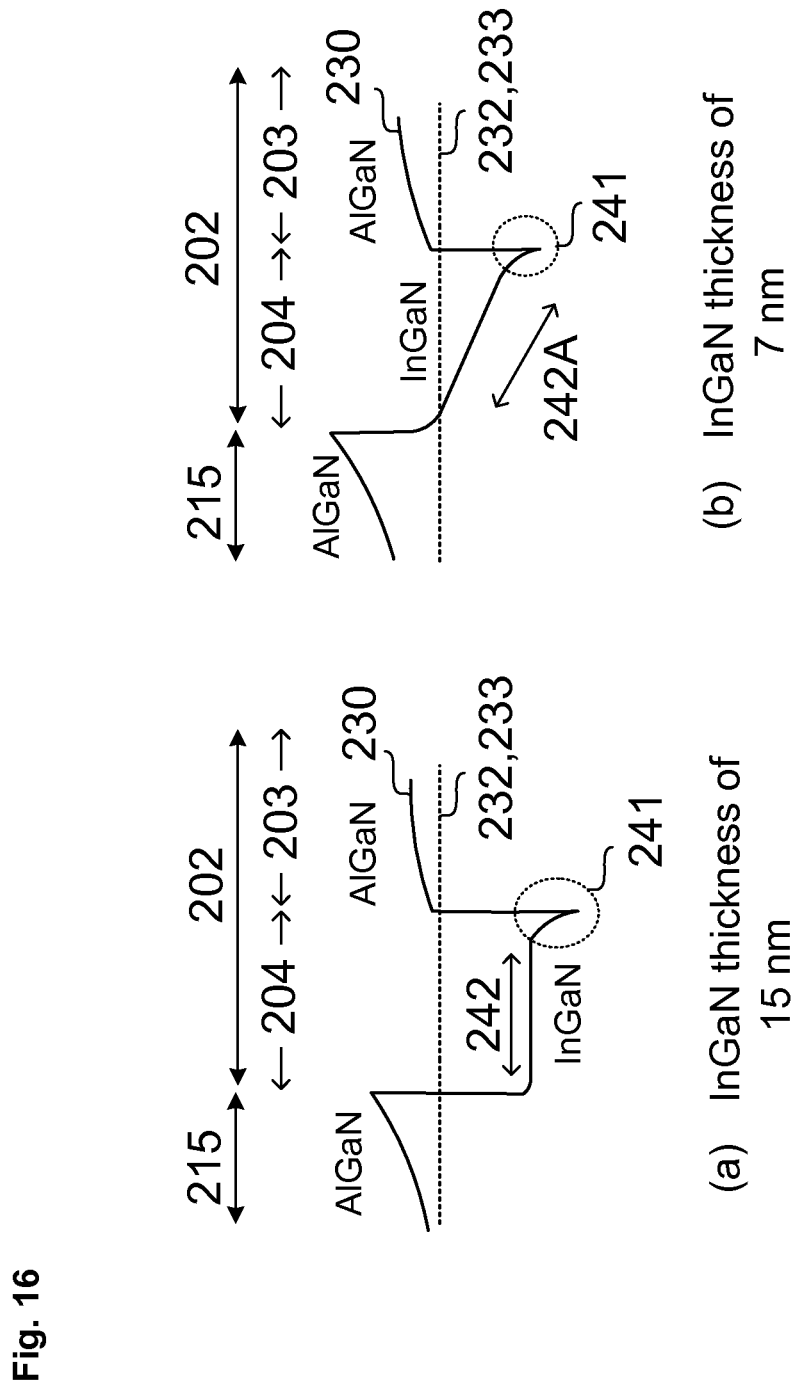
FIG. 16 is a model view showing the energy band diagram of the conduction band of the hetero-structure by reflecting the interaction of the semiconductor materials.

FIG. 16 is a model view showing a state of the conduction band 230, drawn in the same manner as in FIG. 14C. FIG. 16(a) shows a state of the conduction band 230 when the thickness of the InGaN layer 204 is set to be 15 nm which is within the region D4 of FIG. 15, and FIG. 16(b) shows a state of the conduction band 230 when the thickness of the InGaN layer 204 is set to be 7 nm which is out of the region D4. As shown in FIG. 16(b), when the thickness of the InGaN layer 204 is small, an inclination is generated also in the approximately flat band region 242 (region 242A) by largely receiving the influence of the piezoelectric field as described above, and the ability of accumulating the electrons decreases. In contrast, as shown in FIG. 16(a), when the thickness is increased to be 15 nm, this flat band region 242 is widened, and the ability of accumulating the electrons increases.

In FIG. 16, the electrons having a potential exceeding the Fermi level (232, 233) flow to the p-layer side (right side in the Figure). For this reason, in the case of the construction of FIG. 16(b), the electric current flows in the LED element before the electrons are sufficiently accumulated, so that the effect of sufficiently spreading the electric current cannot obtained. In contrast, in the case of the construction of FIG. 16(a), a lot of electrons can be accumulated in the flat band region 242, so that the electrons can be diffused by the two-dimensional electron gas constituted of the band-bending region 241 before the electrons come to have a potential exceeding the Fermi level. This produces a current-diffusion effect, and an effect of improving the optical output is obtained.

From the above, it will be understood that an effect of improving the optical output of the LED element 201 is obtained by setting the thickness of the InGaN layer 204 to be 10 nm or more and 25 nm or less.

Further, by increasing the thickness of InGaN, the voltage-resistance characteristics of the LED element itself are improved, whereby an effect of improving the yield is obtained. FIG. 17 is a table showing a relationship between the thickness of InGaN and the yield of the LED element.

LED elements 201 were fabricated in which the thickness of the InGaN layer 204 were varied to be 3 nm, 5 nm, 10 nm, and 20 nm while fixing the thickness of the AlGaN layer 203 to be 20 nm. Then, after applying a forward voltage and a backward voltage of 500 V, respectively, to each of the LED elements 201, a backward current that flows when −5 V is applied as a backward bias is measured. At this time, the elements in which the absolute value of the backward current was 5 µA or less (or less than 5 µA) were regarded as good elements, and the elements in which the absolute value of the backward current exceeded 5 µA were regarded as poor elements, so as to determine the yield.

According to FIG. 17, the element in which the thickness of the InGaN layer 204 had the largest value of 20 nm gave the highest yield, and the element in which the thickness of the InGaN layer 204 had the smallest value of 3 nm gave the lowest yield. Here, according as the thickness of the InGaN layer 204 is sequentially increased to be 3 nm, 5 nm, 10 nm, and 20 nm, the yield increased. When the thickness of the InGaN layer 204 is 10 nm or more, the tendency of increase in the yield slows down.

The reason why such a phenomenon occurred seems to be that, when the thickness of the InGaN layer 204 is increased, the two-dimensional electron gas layer is more liable to be generated between the InGaN layer 204 ($In_yGa_{1-y}N$ layer 204) and the AlGaN layer 203 ($n-Al_{x1}Ga_{x2}In_{x3}N$ layer 203). As described above, the two-dimensional electron gas layer produces an effect of horizontally spreading the electric current. In accordance therewith, the electric current becomes less likely to be concentrated in a narrow region, and the electric field is alleviated. Consequently, even when a high voltage is momentarily applied, the electric field is diffused in the hetero-structure 202 and, as a result of this, the electric field is less likely to be concentrated, whereby breakage of the element is less likely to occur.

(Studies on the Si-Doping Concentration of the AlGaN Layer 203)

Figure 18:
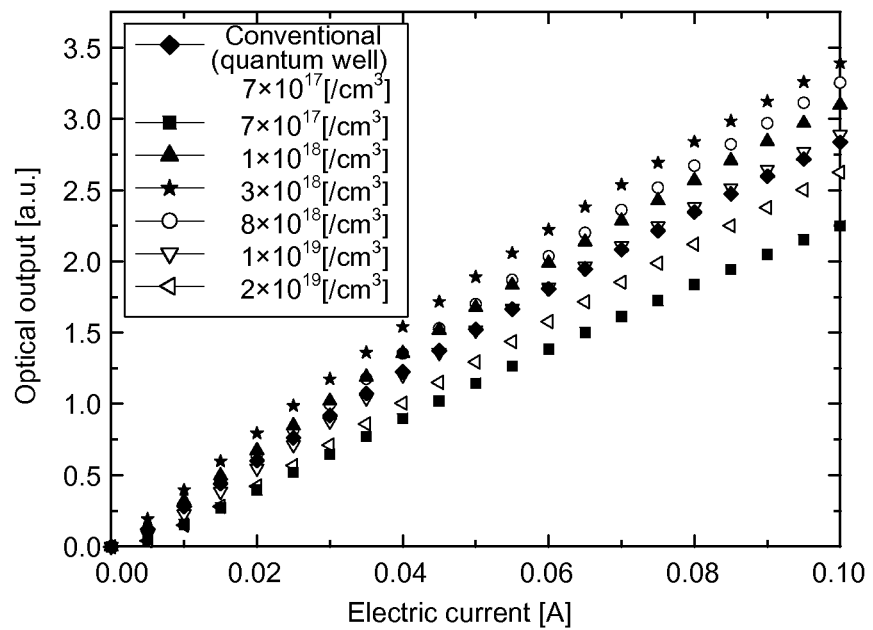
FIG. 18 is a graph showing a relationship between the electric current flowing in the LED element and the optical output obtained from the LED element when the Si-doping concentration of the AlGaN layer constituting the hetero-structure is changed.

FIG. 18 is a graph showing a relationship between the electric current flowing in the LED element 201 and the optical output obtained from the LED element 201 when the Si-doping concentration of the AlGaN layer 203 constituting the hetero-structure 202 is changed. Here, as the InGaN layer 204, the In ratio was set so that the peak light-emission wavelength would be 365 nm (value within a range of 362 nm or more and 395 nm or less), and the thickness was set to be 15 nm (value within a range of 10 nm or more and 25 nm or less).

For comparison, FIG. 18 shows also the results of the conventional LED element 290 provided with an MQW (quantum well). As this element 290, an element in which the active layer 217 formed by the MQW was formed by alternate lamination of InGaN having a thickness of 2 nm and AlGaN having a thickness of 5 nm for five periods was adopted, and the In ratio of InGaN was set so that the peak light-emission wavelength would be 365 nm in the same manner as in the LED element 201. Also, because InGaN constituting the active layer 217 of this LED element 290 has an extremely small thickness as compared with the LED element 201, the Si-doping concentration that can be achieved is at most about 5 to $8\times10^{17}/cm^3$, so that, when the doping concentration is more than 5 to $8\times10^{17}/cm^3$, the optical output decreases. For this reason, in the example of FIG. 18, an element in which the Si-doping concentration was set to be $7\times10^{17}/cm^3$ was used.

Figure 19:
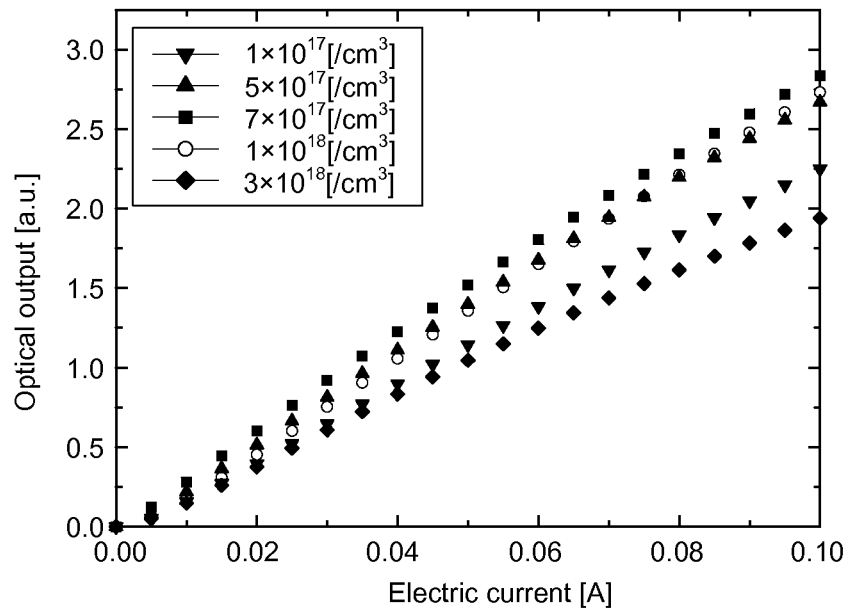
FIG. 19 is a graph showing a relationship between the electric current flowing in a conventional LED element and the optical output obtained from the LED element when the Si-doping concentration of AlGaN constituting the MQW is changed.

Here, FIG. 19 is a graph showing a relationship between the electric current flowing in the LED element 290 and the obtained optical output when the Si-doping concentration of AlGaN constituting the MQW is changed in the LED element 290 having a conventional structure. According to this graph, it will be understood that the highest optical output is obtained when the Si-doping concentration of AlGaN is set to be $7\times10^{17}/cm^3$. Therefore, for comparison with the LED element 201, FIG. 18 shows a case in which the Si-doping concentration is $7\times10^{17}/cm^3$ at which the highest optical output is obtained.

According to FIG. 18, the highest optical output is exhibited when the Si-doping concentration is $3\times10^{18}$ (/$cm^3$). Also, it will be understood that a higher optical output than that of the conventional LED element 290 is exhibited in each of the cases of $1\times10^{18}$ (/$cm^3$), $3\times10^{18}$ (/$cm^3$), $8\times10^{18}$ (/$cm^3$), and $1\times10^{19}$ (/$cm^3$). On the other hand, it will be understood that the optical output decreases as compared with that of the conventional LED element 290 in the case in which the Si-doping concentration is $7\times10^{17}$ (/$cm^3$) which is lower than $1\times10^{18}$ (/$cm^3$) and in the case in which the Si-doping concentration is $2\times10^{19}$ (/$cm^3$) which is higher than $1\times10^{19}$ (/$cm^3$).

In the case in which the Si-doping concentration of the AlGaN layer 203 is $7\times10^{17}/cm^3$, it seems that the absolute Si concentration is low, so that the screening effect of the conduction band 230 is small, and the carriers are not sufficiently taken into the region (42, 43) (See FIG. 14C). On the other hand, in the case in which the Si-doping concentration of the AlGaN layer 203 is $2\times10^{19}/cm^3$, it seems that a so-called droop phenomenon is generated in which the light-emission recombination probability decreases due to the overflow of electrons, and the internal light-emission efficiency is deteriorated, whereby the optical output decreases.

Figure 20:
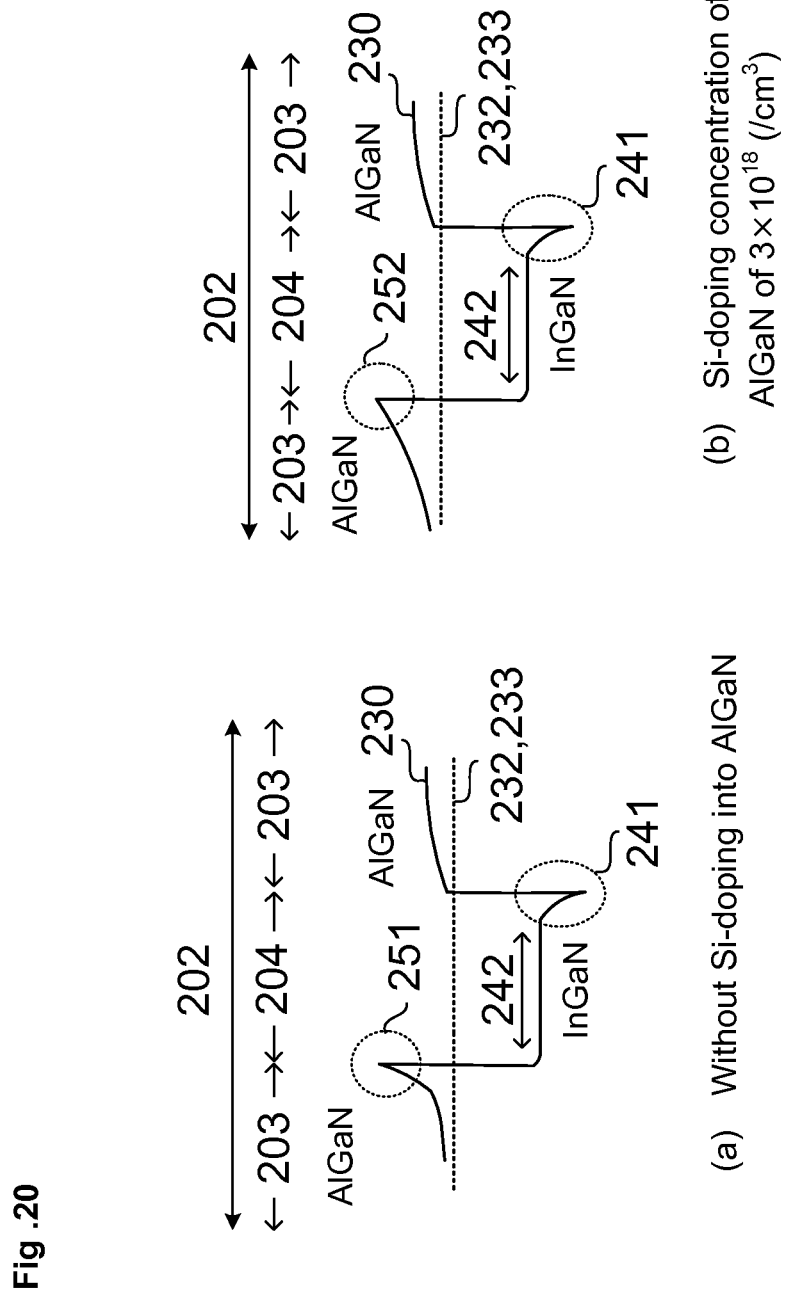
FIG. 20 is a model view showing the energy band diagram of the conduction band of the hetero-structure by reflecting the interaction of the semiconductor materials.

The screening effect of the conduction band 230 will be described with reference to FIG. 20. FIG. 20(a) is a model view showing the conduction band 230 of the hetero-structure 202 when the AlGaN layer 203 is not doped with Si, and FIG. 20(b) is a model view showing the conduction band 230 of the hetero-structure 202 when the Si-doping concentration of the AlGaN layer 203 is set to be $3\times10^{18}$ (/$cm^3$).

As described above, when a crystal of AlGaN constituting the n-type cladding layer 215 is grown on the c-plane of the GaN crystal constituting the undoped layer 213, a piezo-electric field is generated based on the lattice constant difference. Due to this electric field, an inclination is generated (region 251) in the conduction band 130 formed by n-AlGaN constituting the n-type cladding layer 215 and the AlGaN layer and the InGaN layer constituting the hetero-structure 202. The presence of this inclination hinders the movement of electrons to the p-layer side (right side in the Figure). On the other hand, when the AlGaN layer 203 is doped with Si, the electric field acts in the direction of cancelling the piezoelectric field, so that an effect of pressing the conduction band 230 down is produced. As a result of this, the inclination of the conduction band 230 is alleviated (region 252), thereby facilitating the injection of electrons from the n-layer side to the band-bending region 241 and the approximately flat band region 242.

In particular, in the case of designing the LED element 201 as a high-injection device of about 100 A/$cm^2$, it is preferable to adopt a construction capable of injecting more electrons. From this result also, it is preferable to set the Si concentration in doping the AlGaN layer 203 to be high. However, when the Si-doping concentration is set to be too high, a droop phenomenon occurs as described above. Therefore, the optical output can be improved by setting the Si-doping concentration to be $1 \times 10^{18}/cm^3$ or more and $5 \times 10^{18}/cm^3$ or less.

Figure 21:
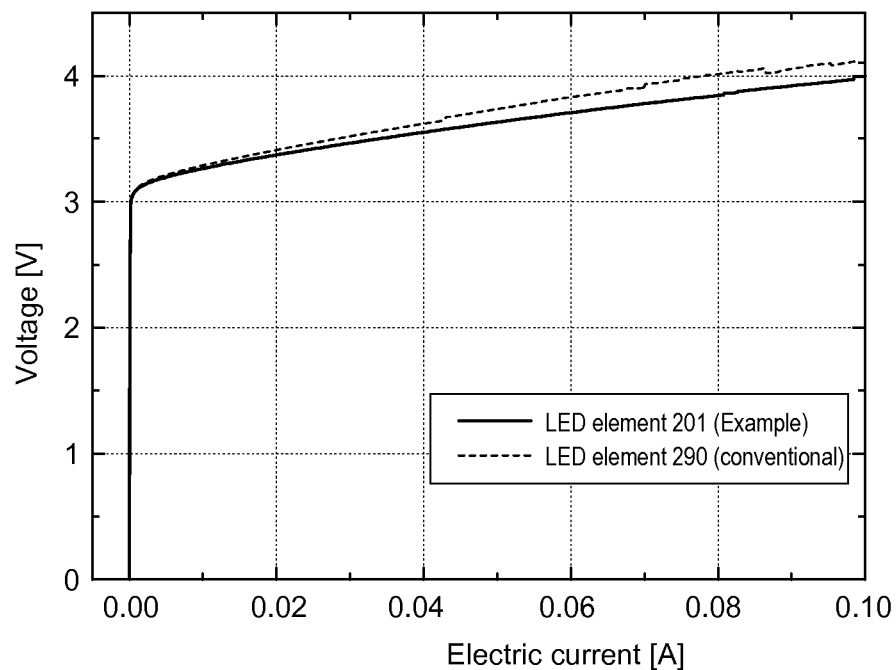
FIG. 21 is a view showing the current-voltage characteristics of the LED element in a graph.

FIG. 21 is a view showing the current-voltage characteristics in each of the conventional LED element 290 and the LED element 201 of the present invention in a graph when an operation voltage is applied between the elements to let the electric current flow.

Here, as the conventional LED element 290, an element in which the active layer 217 formed by the MQW was formed by alternate lamination of InGaN having a thickness of 2 nm and AlGaN having a thickness of 5 nm for five periods was adopted, and the Si-doping concentration into the AlGaN layer was set to be $7 \times 10^{17}/cm^3$. Also, as the LED element 201 of the present invention, a construction in which the hetero structure 202 made by the InGaN layer 204 having a thickness of 15 nm and the AlGaN layer 203 having a thickness of 20 nm was laminated for five periods was adopted, and the Si-doping concentration into the AlGaN layer 203 was set to be $3 \times 10^{18}/cm^3$. Also, in each of the elements, the In ratio of the InGaN layer was set so that the peak light-emission wavelength would be 365 nm In other words, as the conventional LED element 290, an element in which the Si-doping concentration showing the highest value of the optical output in FIG. 19 was applied to the AlGaN layer was adopted. As the LED element 201, an element in which the Si-doping concentration showing the highest value of the optical output in FIG. 18 was applied to the AlGaN layer 203 was adopted.

According to FIG. 21, it will be understood that, when the applied electric current is increased, reduction of the operation voltage of the LED element 201 is achieved as compared with the conventional LED element 290. This is another effect produced by the fact that the Si-doping concentration into the AlGaN layer 203 could be set at a higher concentration than that of the conventional element.

[Method of Producing LED Element 201]

Next, a method of producing the LED element 201 of the present invention will be described. Here, the production conditions and the dimensions such as the thickness in the following description of the production method are merely examples, so that the present invention is not limited to these numerical values. Also, the examples of the production method shown below pertain to the LED element shown in FIG. 10.

<Step S1A>

First, an undoped layer 213 is formed on a support substrate 211. For example, this is carried out through the following steps.

(Preparation of Support Substrate 211)

When a sapphire substrate is to be used as the support substrate 211, cleaning of a c-plane sapphire substrate is carried out. More specifically, this cleaning is carried out, for example, by placing the c-plane sapphire substrate in a processing furnace of an MOCVD (Metal Organic Chemical Vapor Deposition: organic metal chemical gas-phase vapor deposition) apparatus and raising the temperature within the furnace to be, for example, 1150° C. while allowing a hydrogen gas to flow at a flow rate of 10 slm in the processing furnace.

(Forming Undoped Layer 213)

Next, a low-temperature buffer layer made of GaN is formed on the surface of the support substrate 211 (c-plane sapphire substrate), and further an underlayer made of GaN is formed on top thereof. The low-temperature buffer layer and the underlayer correspond to the undoped layer 213.

A more specific method of forming the undoped layer 213 is, for example, as follows. First, the pressure within the furnace of the MOCVD apparatus is set to be 100 kPa, and the temperature within the furnace is set to be 480° C. Then, trimethylgallium (TMG) having a flow rate of 50 μmol/min and ammonia having a flow rate of 250000 μmol/min are supplied as source material gases for 68 seconds into the processing furnace while allowing a nitrogen gas and a hydrogen gas each having a flow rate of 5 slm to flow as carrier gases in the processing furnace. By this process, the low-temperature buffer layer made of GaN and having a thickness of 20 nm is formed on the surface of the support substrate 211.

Next, the temperature within the furnace of the MOCVD apparatus is raised to 1150° C. Then, TMG having a flow rate of 100 μmol/min and ammonia having a flow rate of 250000 μmol/min are supplied as source material gases for 30 minutes into the processing furnace while allowing a nitrogen gas having a flow rate of 20 slm and a hydrogen gas having a flow rate of 15 slm to flow as carrier gases in the processing furnace. By this process, the underlayer made of GaN and having a thickness of 1.7 μm is formed on the surface of the first buffer layer.

<Step S2A>

Next, an n-type cladding layer 215 constituted of n-$Al_nGa_{1-n}N$ (0<n≤1) is formed on top of the undoped layer 213.

A more specific method of forming the n-type cladding layer 215 is, for example, as follows. First, the pressure within the furnace of the MOCVD apparatus is set to be 30 kPa. Then, TMG having a flow rate of 94 μmol/min, trimethylaluminum (TMA) having a flow rate of 6 μmol/min, ammonia having a flow rate of 250000 μmol/min, and tetraethylsilane having a flow rate of 0.025 μmol/min are supplied as source material gases for 30 minutes into the processing furnace while allowing a nitrogen gas having a flow rate of 20 slm and a hydrogen gas having a flow rate of 15 slm to flow as carrier gases in the processing furnace. By this process, a high-concentration electron supply layer having a composition of $Al_{0.06}Ga_{0.94}N$ with an Si concentration of $3 \times 10^{19}/cm^3$ and a thickness of 1.7 μm is formed on top of the undoped layer 213. In other words, by this process, the n-type cladding layer 215 having the high-concentration electron supply layer with an Si concentration of $3 \times 10^{19}/cm^3$ and a thickness of 1.7 μm is formed at least with respect to the region of the upper surface.

Here, the description has been given assuming that silicon (Si) is to be used as the n-type impurity contained in the n-type cladding layer 215; however, germanium (Ge), sulfur (S), selenium (Se), tin (Sn), tellurium (Te), and others may be used as well. Among these, silicon (Si) is especially preferable.

<Step S3A>

Next, a hetero-structure 202 constituted of an n-$Al_xGa_{1-x}$N layer 203 and an $In_yGa_{1-y}$N layer 204 is formed on top of the n-type cladding layer 215.

A more specific method of forming the hetero-structure 202 is, for example, as follows. First, the pressure within the furnace of the MOCVD apparatus is set to be 100 kPa, and the temperature within the furnace is set to be 830° C. Then, a step of supplying TMG having a flow rate of 10 μmol/min, trimethylindium (TMI) having a flow rate of 12 μmol/min, and ammonia having a flow rate of 300000 μmol/min as source material gases for 360 seconds into the processing furnace is carried out while allowing a nitrogen gas having a flow rate of 15 slm and a hydrogen gas having a flow rate of 1 slm to flow as carrier gases in the processing furnace.

Thereafter, a step of supplying TMG having a flow rate of 10 µmol/min, TMA having a flow rate of 1.6 µmol/min, tetraethylsilane having a flow rate of 0.009 µmol/min, and ammonia having a flow rate of 300000 µmol/min for 360 seconds into the processing furnace is carried out. By this process, the hetero-structure 202 made of the InGaN layer 204 having a thickness of 15 nm and the n-AlGaN layer 203 having a thickness of 20 nm is formed.

Here, in the case of adopting a construction in which the hetero-structure 202 is provided for a plurality of periods as shown in FIGS. 11 and 12, the construction can be achieved by repeating the present step S3A for a plurality of times.
<Step S4A>

Next, a p-type cladding layer 119 constituted of p-$Al_cGa_{1-c}N$ ($0<c\leq1$) is formed on top of the hetero-structure 202 (located at the topmost layer: in case the hetero-structure 202 is provided for a plurality of periods), and further a high-concentration p-type contact layer 221 is formed on top thereof.

A more specific method of forming the p-type cladding layer 219 and the p-type contact layer 221 is, for example, as follows. First, the pressure within the furnace of the MOCVD apparatus is maintained to be 100 kPa, and the temperature within the furnace is raised to 1050° C. while allowing a nitrogen gas having a flow rate of 15 slm and a hydrogen gas having a flow rate of 25 slm to flow as carrier gases in the processing furnace. Thereafter, TMG having a flow rate of 35 TMA having a flow rate of 20 µmol/min, ammonia having a flow rate of 250000 µmol/min, and biscyclopentadienylmagnesium ($Cp_2Mg$) having a flow rate of 0.1 µmol/min are supplied as source material gases for 60 seconds into the processing furnace. By this process, a hole supply layer having a composition of $Al_{0.3}Ga_{0.7}N$ and a thickness of 20 nm is formed on the surface of the uppermost layer of the hetero-structure 202. Thereafter, by changing the flow rate of TMA to 9 µmol/min and supplying the source material gases for 360 seconds, a hole supply layer having a composition of $Al_{0.07}Ga_{0.93}N$ and a thickness of 120 nm is formed. The p-type cladding layer 219 is formed by these hole supply layers.

Further thereafter, the supply of TMA is stopped, and the flow rate of $Cp_2Mg$ is changed to 0.2 µmol/min, so as to supply the source material gases for 20 seconds. By this process, the p-type contact layer 221 made of p-GaN and having a thickness of 5 nm is formed.

Here, the description has been given assuming that magnesium (Mg) is to be used as the p-type impurity contained in the p-type cladding layer 219 and the p-type contact layer 221; however, beryllium (Be), zinc (Zn), carbon (C), and others may be used as well.
<Step S5A>

Next, an activation process is carried out on the wafer obtained through the steps S1A, S2A, S3A, and S4A. More specifically, an activation process of 15 minutes at 650° C. in a nitrogen atmosphere is carried out using an RTA (Rapid Thermal Anneal: rapid heating) apparatus.

Thereafter, in the case of achieving a LED element of longitudinal type, the support substrate 211 is peeled off, and thereafter, an electrode is formed at the site where the support substrate 211 was present, so as to form an n-side electrode. Alternatively, in the case of achieving a LED element of lateral type, etching is carried out from the p-side until the n-type semiconductor layer is exposed, and an n-side electrode is formed. Here, in this case, an electrode such as a transparent electrode may be formed in accordance with the needs. Thereafter, a power supply terminal and the like are formed on each electrode. Then, in accordance with the needs, the exposed element side surface and top surface are covered with an insulating layer having a high light transmittance, and connection to a substrate is implemented by wire bonding or the like.

OTHER EMBODIMENTS

Hereafter, other embodiments of the first embodiment will be described.

Figure 22:
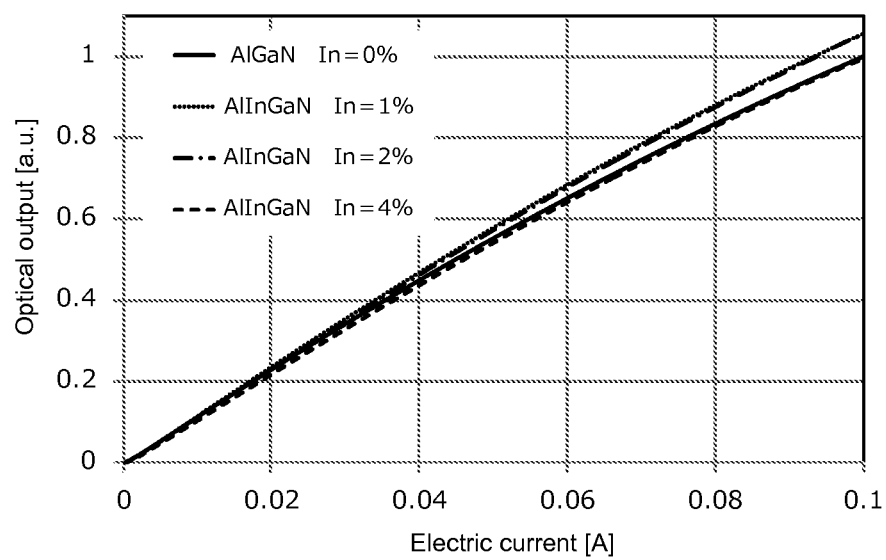
FIG. 22 is a graph showing a relationship between the optical output and the electric current supplied to the LED element that has been fabricated by varying the In composition contained in the sixth semiconductor layer.

In the above-described embodiment, description has been given assuming that the sixth semiconductor layer is constituted of the n-$Al_xGa_{1-x}N$ layer 203 having an In composition of 0%; however, the sixth semiconductor layer may be constituted of n-$Al_{x1}Ga_{x2}In_{x3}N$ ($0<x1<1$, $0<x2<1$, $0\leq x3\leq0.05$, $x1+x2+x3=1$) obtained by addition of In in a composition within a range of 5% or less. FIG. 22 is a graph showing a relationship between the optical output and the electric current supplied to the LED element that has been fabricated by varying the In composition contained in the sixth semiconductor layer. The value of the optical output indicated by the longitudinal axis of FIG. 22 is defined as a value relative to the optical output when a current of 0.1 A is supplied to the LED element in which the sixth semiconductor layer has been formed of n-$Al_xGa_{1-x}N$ that does not contain In.

Here, a method of allowing In to be contained in the fourth semiconductor layer may be achieved in such a manner that, in performing the step of supplying TMG, TMA, tetraethylsilane, and ammonia in the above-described step S3A, TMI is supplied at a predetermined flow rate together with these gases.

According to FIG. 22, it will be understood that, in the case in which In was allowed to be contained at 4% in the sixth semiconductor layer, the obtained optical output was not so much different from that of the case in which the sixth semiconductor layer had been constructed without allowing In to be contained. Also, in the case in which In was allowed to be contained at 1% in the sixth semiconductor layer and in the case in which In was allowed to be contained at 2% in the sixth semiconductor layer, the obtained optical output was improved as compared with the case in which the sixth semiconductor layer had been constructed without allowing In to be contained. This seems to be due to the fact that, by allowing In to be contained in AlGaN, the distortion generated by the lattice mismatch of AlGa(In)N and InGaN was alleviated, and the surface state thereof was improved.

However, when In is allowed to be contained too excessively in the sixth semiconductor layer, there is a fear of raising a problem such that the overflow of electrons becomes conspicuous because the energy barrier to the InGaN layer becomes low and a problem such that the effect of the two-dimensional electron gas decreases due to reduction of the piezo electrode. FIG. 22 shows that the case in which the content of In in the sixth semiconductor layer is 4% gives an optical output almost equivalent to that of the case in which In is not contained. However, it has been confirmed that, even in the case in which the content is about 5%, the difference is not so large. However, when the composition of In exceeds 5%, the optical output decreases significantly as compared with the case in which the sixth semiconductor layer is constructed with AlGaN that does not contain In, due to the above-described reasons. Therefore, the composition of In that is allowed to be contained in the sixth semiconductor layer is preferably 0% or more and 5% or less.

DESCRIPTION OF REFERENCE SIGNS

101 LED element
103 current-diffusion layer 111 support substrate
113 undoped layer
115 n-type cladding layer
117 active layer
119 p-type cladding layer
121 p-type contact layer
130 conduction band
131 valence electron band
132 Fermi level of InGaN
133 Fermi level of AlGaN
141 Band-bending region formed at interface between AlGaN and InGaN
142 Approximately flat band region formed by InGaN
181 tensile stress
190 LED element
201 LED element
202 hetero-structure
202A multilayer structure part
203 n-$Al_xGa_{1-x}N$ layer (n-$Al_{x1}Ga_{x2}In_{x3}N$ layer)
204 $In_yGa_{1-y}N$ layer
211 support substrate
213 undoped layer
215 n-type cladding layer
217 active layer
219 p-type cladding layer
221 p-type contact layer
230 conduction band
231 valence electron band
232 Fermi level of InGaN
233 Fermi level of AlGaN
241 Band-bending region formed at interface between AlGaN and InGaN
242 Approximately flat band region formed by InGaN
281 tensile stress
290 LED element

The invention claimed is:

1. An LED element, comprising:
   a first semiconductor layer constituted of an n-type nitride semiconductor;
   a current-diffusion layer formed on the first semiconductor layer;
   an active layer formed on the current-diffusion layer and constituted of a nitride semiconductor; and
   a second semiconductor layer formed on the active layer and constituted of a p-type nitride semiconductor, wherein
   the current-diffusion layer has a hetero-structure having a third semiconductor layer constituted of $In_xGa_{1-x}N$ (0<x≤0.05) and a fourth semiconductor layer constituted of n-$Al_{y1}Ga_{y2}In_{y3}N$ (0<y1<1, 0<y2<1, 0≤y3≤0.05, y1+y2+y3=1), the third semiconductor layer having a thickness of more than 10 nm and 25 nm or less.

2. The LED element according to claim 1, wherein a band gap energy of the third semiconductor layer is smaller than a band gap energy of each of the first semiconductor layer and the fourth semiconductor layer.

3. The LED element according to claim 1, wherein an Si-doping concentration of the fourth semiconductor layer is $1\times10^{18}/cm^3$ or more and $5\times10^{18}/cm^3$ or less.

4. The LED element according to claim 1, wherein the current-diffusion layer has a plurality of the hetero-structure formed by lamination of a plurality of pairs of the third semiconductor layer and the fourth semiconductor layer.

5. An LED element, comprising:
   a support substrate,
   an undoped layer formed on the support substrate;
   a fifth semiconductor layer formed on the undoped layer and constituted of an n-type nitride semiconductor;
   a hetero-structure formed of a lamination structure on the fifth semiconductor layer, the lamination structure obtained by lamination of a sixth semiconductor layer constituted of n-$Al_{x1}Ga_{x2}In_{x3}N$ (0<x1<1, 0<x2<1, 0≤x3≤0.05, x1+x2+x3=1) having an Si-doping concentration of $1\times10^{18}/cm^3$ or more and $1\times10^{19}/cm^3$ or less and a seventh semiconductor layer constituted of $In_yGa_{1-y}N$ (0<y<1) having a thickness of more than 10 nm and 25 nm or less; and
   an eighth semiconductor layer formed on the hetero-structure and constituted of a p-type nitride semiconductor, wherein
   a peak light-emission wavelength is 362 nm or more and 395 nm or less.

6. The LED element according to claim 5, having a multilayer structure part obtained by repetition of the hetero-structure for a plurality of periods, wherein
   the eighth semiconductor layer is formed on the hetero-structure located at the topmost layer of the multilayer structure part.

7. The LED element according to claim 2, wherein an Si-doping concentration of the fourth semiconductor layer is $1\times10^{18}/cm^3$ or more and $5\times10^{18}/cm^3$ or less.

8. The LED element according to claim 2, wherein the current-diffusion layer has a plurality of the hetero-structure formed by lamination of a plurality of pairs of the third semiconductor layer and the fourth semiconductor layer.

9. The LED element according to claim 3, wherein the current-diffusion layer has a plurality of the hetero-structure formed by lamination of a plurality of pairs of the third semiconductor layer and the fourth semiconductor layer.

10. The LED element according to claim 1, wherein an Si-doping concentration of the fourth semiconductor layer is $3\times10^{18}/cm^3$ or more and $5\times10^{18}/cm^3$ or less.

* * * * *